(12) United States Patent
Ishizaka et al.

(10) Patent No.: US 10,483,100 B2
(45) Date of Patent: Nov. 19, 2019

(54) METHOD FOR FORMING TION FILM

(71) Applicant: TOKYO ELECTRON LIMITED, Tokyo (JP)

(72) Inventors: Tadahiro Ishizaka, Yamanashi (JP); Masaki Koizumi, Yamanashi (JP); Masaki Sano, Yamanashi (JP); Seokhyoung Hong, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 58 days.

(21) Appl. No.: 15/273,383

(22) Filed: Sep. 22, 2016

(65) Prior Publication Data
US 2017/0092489 A1   Mar. 30, 2017

(30) Foreign Application Priority Data

Sep. 25, 2015 (JP) ................. 2015-188144
Dec. 22, 2015 (JP) ................. 2015-249585
May 6, 2016 (JP) ................. 2016-093059

(51) Int. Cl.
*H01L 21/02* (2006.01)
*H01L 21/67* (2006.01)
(Continued)

(52) U.S. Cl.
CPC ...... *H01L 21/02186* (2013.01); *C23C 16/308* (2013.01); *C23C 16/45531* (2013.01);
(Continued)

(58) Field of Classification Search
CPC ........... H01L 21/02186; H01L 21/0228; H01L 21/0234; H01L 21/02326; C23C 16/308; C23C 16/45531
See application file for complete search history.

(56) References Cited

U.S. PATENT DOCUMENTS 5,685,960 A    11/1997 Fu et al.
9,540,729 B1 *  1/2017 Okura ............... C23C 16/45525
(Continued)

FOREIGN PATENT DOCUMENTS

JP    2003-077864 A    3/2003
JP    2006-319157 A    11/2006
(Continued)

OTHER PUBLICATIONS

E. Cartier et al., "Oxygen passivation of vacancy defects in metal-nitride gated HfO2/SiO2/Si devices", Appl. Phys. Lett. 95, 042901 (2009).

Primary Examiner — Kelly M Gambetta
(74) Attorney, Agent, or Firm — Fenwick & West LLP

(57) ABSTRACT

A TiON film forming method is provided. A cycle of forming a unit TiN film at a predetermined processing temperature by alternately supplying a Ti-containing gas and a nitriding gas into the processing chamber accommodating a target substrate and oxidizing the unit TiN film by supplying an oxidizing agent into the processing chamber is repeated multiple times. In an initial stage of the film formation, a cycle of repeating the alternate supply of the Ti-containing gas and the nitriding gas X1 times and supplying the oxidizing agent is repeated Y1 times. In a later stage of the film formation, a cycle of repeating the alternate supply of the Ti-containing gas and the nitriding gas X2 times and supplying the oxidizing agent is repeated Y2 times until a desired film thickness is obtained. The number of repetition X1 is set to be greater than the number of repetition X2.

18 Claims, 20 Drawing Sheets

(51) Int. Cl.
   *C23C 16/30* (2006.01)
   *C23C 16/455* (2006.01)
   *H01L 27/11582* (2017.01)
   *H01L 49/02* (2006.01)

(52) U.S. Cl.
   CPC ...... *H01L 21/0228* (2013.01); *H01L 21/0234* (2013.01); *H01L 21/02326* (2013.01); *H01L 21/67017* (2013.01); *H01L 21/67213* (2013.01); *H01L 27/11582* (2013.01); *H01L 28/00* (2013.01)

(56) References Cited

U.S. PATENT DOCUMENTS

| | | | |
|---|---|---|---|
| 2004/0106261 A1* | 6/2004 | Huotari | H01L 21/28088 438/287 |
| 2004/0235191 A1 | 11/2004 | Hasegawa | |
| 2007/0040203 A1* | 2/2007 | Lee | H01L 28/75 257/303 |
| 2011/0028002 A1 | 2/2011 | Hirota | |
| 2013/0149852 A1* | 6/2013 | Nakamura | H01L 21/28079 438/585 |
| 2015/0017319 A1* | 1/2015 | Jung | C23C 16/4404 427/8 |

FOREIGN PATENT DOCUMENTS

| | | |
|---|---|---|
| JP | 2011-034995 A | 2/2011 |
| JP | 2014-175509 A | 9/2014 |
| JP | 2015-506097 A | 2/2015 |
| KR | 10-2004-0006481 A | 1/2004 |

\* cited by examiner

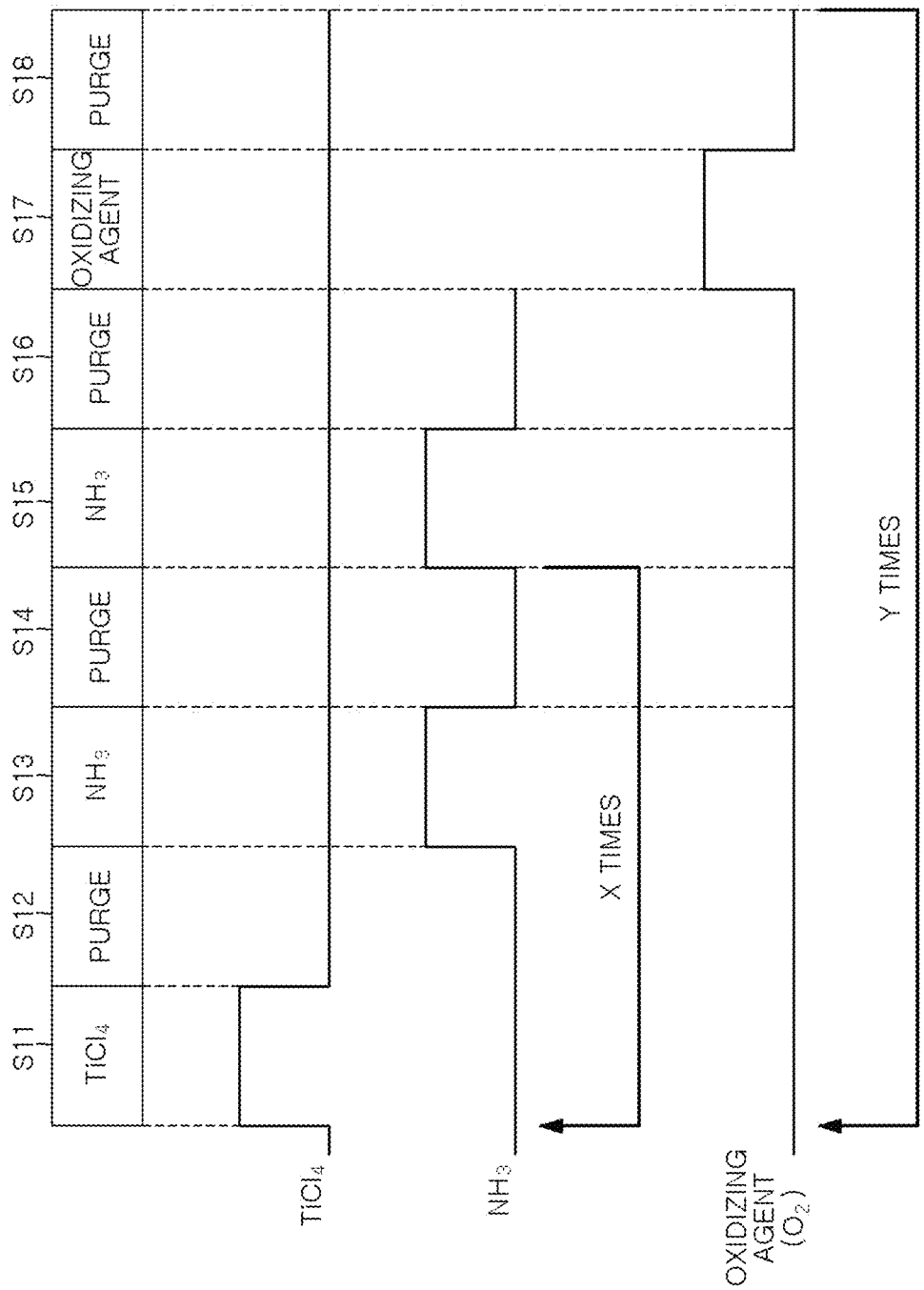

BEFORE Ar ION TREATMENT

AFTER Ar ION TREATMENT

METHOD FOR FORMING TiON FILM

CROSS-REFERENCE TO RELATED APPLICATIONS

This application claims priority to Japanese Patent Application No. 2015-188144 filed on Sep. 25, 2015, Japanese Patent Application No. 2015-249585 filed on Dec. 22, 2015 and Japanese Patent Application No. 2016-093059 filed on May 6, 2016, the entire contents of which are incorporated herein by reference.

FIELD OF THE INVENTION

The disclosure relates to a method for forming a TiON film.

BACKGROUND OF THE INVENTION

Recently, miniaturization of semiconductor devices is advancing in order to improve performance of the devices. Further, it is required to reduce power consumption of the semiconductor devices due to the effect on the environment or the application to mobile devices. To that end, in a MOSFET, a combination of a metal gate and a high-k film made of a high-k material is introduced. The high-k (high dielectric constant) film is also used for a capacitor unit in order to increase a capacity of a DRAM.

As for the high-k film, a laminated film of oxides such as $HfO_2$ and $ZrO_2$ or $Al_2O_3$ and $ZrO_2$ is used. However, in the case of using such an oxide material for the semiconductor devices, an oxygen vacancy may occur in the high-k film. If the oxygen vacancy occurs in the high-k film, a dipole is generated at an interface of the electrode or the metal gate adjacent to the high-k film and a band is bent by the dipole, which leads to a low effective work function. As a result, electrons readily flow and a leakage current is increased.

As for a technique for solving the above drawback, techniques for reducing oxygen vacancy in a high-k film by adding oxygen to a TiN film used as the electrode or the metal gate formed on the high-k film are disclosed in Japanese Patent Application Publication No. 2015-506097 and E. Cartier, et al., Appl. Phys. Lett., Vol. 95, 2009, p. 042901. Specifically, the TiN film is formed by PVD (Physical Vapor Deposition) and, then, oxygen is added to the TiN film by performing oxygen plasma processing or annealing using oxygen-containing gas.

However, as the miniaturization of the semiconductor devices progresses, when a film is formed, a high step coverage is required in a fine pattern and, also, high controllability of a thin film is required. Therefore, when the TiN film is formed, sufficiently high step coverage is not obtained by the PVD and a sufficiently high controllability of the thin film is not obtained even by CVD (Chemical Vapor Deposition) that provides a better step coverage compared to PVD. Further, in the case of the technique disclosed in Japanese Patent Application Publication No. 2015-506097 and E. Cartier, et al., Appl. Phys. Lett., Vol. 95, 2009, p. 042901, the amount of oxygen to be added to the TiN film is limited and, thus, a desired amount of oxygen may not be added.

Therefore, it is examined to form a TiON film by exposing a TiN film to an oxygen plasma or by flowing an oxygen-containing gas at a regular interval during film formation based on a method for forming a TiN film by alternately supplying a $TiCl_4$ gas as a Ti-containing gas and a $NH_3$ gas as a nitriding gas while ensuring an excellent step coverage and high controllability (see, e.g., Japanese Patent Application Publication No. 2003-077864). Accordingly, it is possible to ensure an excellent step coverage and high film formation controllability and also possible to add a sufficient amount of oxygen to the film.

However, it was found that the technique for supplying an oxidizing agent such as an oxygen plasma, an oxygen-containing gas or the like at a regular interval during the TiN film formation by alternate supply of $TiCl_4$ gas and $NH_3$ gas is disadvantageous in that the smoothness of the film becomes poor due to the supply of the oxidizing agent in the initial stage of the film formation.

If the aspect ratio is increased as the miniaturization of the devices progresses, e.g., as an opening of a capacitor structure of a DRAM becomes narrower, reduction of $TiCl_4$ at a bottom (cylinder bottom) of a via may not be sufficient. When the reduction is insufficient, chlorine is separated from $TiCl_4$ by the following reaction (1). However, the nitriding of Ti by the following reaction (2) may not be sufficient.

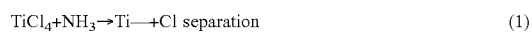
$$TiCl_4 + NH_3 \rightarrow Ti \rightarrow Cl \text{ separation} \qquad (1)$$

$$Ti \rightarrow NH_3 \rightarrow TiN \text{ nitriding} \qquad (2)$$

When the reaction (1) occurs but the reaction (2) is insufficient, a dangling bond exists at the TiN film before oxidation. Since the dangling bond is active, it readily reacts with oxygen in the high-k film even during the film formation and, thus, oxygen vacancy occurs in the high-k film. Accordingly, even If the TiON film is formed near the high-k film, it is difficult to sufficiently improve the characteristics of the devices.

Further, it was found that the technique for supplying an oxidizing agent such as an oxygen-containing gas, an oxygen plasma or the like at a regular interval during the film formation performed by alternate supply of $TiCl_4$ gas and $NH_3$ gas has drawbacks in which Cl of about 0.7 at. % remains and smoothness is poor.

In the case of forming a TiON film in a via having a high aspect ratio or the like, it may be difficult for oxygen to reach the bottom of the via. In that case, it is required to increase an oxidizing efficiency.

SUMMARY OF THE INVENTION

In view of the above, the disclosure provides a method for forming a TiON film which suppresses deterioration of smoothness caused by supplying an oxidizing agent at an initial stage of the film formation based on a film forming technique of supplying an oxidizing agent during a process of forming a film by alternately supplying a Ti-containing gas and a nitriding gas.

The disclosure also provides a method for forming a TiON film which can suppress generation of a dangling bond at a TiN film before supply of an oxidizing agent based on a film forming technique of supplying an oxidizing agent during a process of forming a TiN film by alternately supplying a Ti-containing gas and a nitriding gas.

The disclosure provides a TiON film forming method capable of reducing Cl concentration based on a film forming technique of supplying an oxidizing agent during a process of forming a film by alternately supplying $TiCl_4$ gas as a Ti-containing gas and a nitriding gas.

The disclosure provides a TiON film forming method capable of increasing an oxidation efficiency based on a film forming technique of supplying an oxidizing agent during a process of forming a film by alternately supplying a $TiCl_4$ gas as a Ti-containing gas and a nitriding gas.

In accordance with a first aspect, there is provided a TiON film forming method. A target substrate is accommodated in a processing chamber. An inside of the processing chamber is maintained in a depressurized state. A cycle of forming a unit TiN film at a predetermined processing temperature by alternately supplying a Ti-containing gas and a nitriding gas into the processing chamber and oxidizing the unit TiN film by supplying an oxidizing agent into the processing chamber is repeated multiple times. In an initial stage of the film formation, a cycle of supplying the oxidizing agent after repeating X1 times the alternate supply of the Ti-containing gas and the nitriding gas is repeated Y1 times. In a later stage of the film formation, a cycle of supplying the oxidizing agent after repeating X2 times the alternate supply of the Ti-containing gas and the nitriding gas is repeated Y2 times until a desired film thickness is obtained. The number of repetition X1 in the initial stage of the film formation is set to be greater than the number of repetition X2 in the later stage of the film formation.

The X1 is preferably within a range of $10 \leq X1 \leq 60$ and the X2 is preferably within a range of $1 \leq X2 \leq 25$. The X1 is preferably at least three times greater than the X2. The Y1 is preferably within a range of $1 \leq Y1 \leq 5$.

In accordance with a second aspect, there is provided a TiON film forming method. A target substrate is accommodated in a processing chamber. An inside of the processing chamber is maintained in a depressurized state. A cycle of forming a unit TiN film at a predetermined processing temperature by alternately supplying a Ti-containing gas and a nitriding gas into the processing chamber, performing a post flow process of supplying the nitriding gas into the processing chamber, and oxidizing the unit TiN film by supplying an oxidizing agent into the processing chamber is repeated multiple times.

The post flow process may be performed by repeating supply of the nitriding gas and supply of a purge gas multiple times. The oxidizing agent may be supplied intermittently multiple times.

In accordance with a third aspect, there is provided a TiON film forming method. A target substrate is accommodated in a processing chamber. An inside of the processing chamber is maintained in a depressurized state.

A film is formed by repeating multiple times a cycle of forming a unit TiN film at a predetermined processing temperature by alternately supplying a Ti-containing gas containing Cl and a nitriding gas with a process of purging the processing chamber interposed therebetween and then oxidizing the unit TiN film by supplying an oxidizing agent. Ar ion treatment is performed on the surface of the film.

The Ar ion treatment may be performed by generating an Ar plasma and attracting Ar ions in the Ar plasma to the target substrate. The Ar ion treatment may be performed on the surface of the film by bombardment effect of the Ar ions.

The film formation and the Ar ion treatment may be performed by separate apparatuses. The apparatus for performing the film formation and the apparatus for performing the Ar ion treatment are installed in a processing system including a transfer system for transferring the target substrate in a vacuum state and consecutively perform the film formation and the Ar ion treatment while maintaining a vacuum state. The film formation and the Ar ion treatment may be performed in a same processing chamber.

In accordance with a fourth aspect, there is provided a TiON film forming method. A target substrate is accommodated in a processing chamber. An inside of the processing chamber is maintained in a depressurized state. A cycle of forming a unit TiN film at a predetermined processing temperature by alternately supplying a Ti-containing gas and a nitriding gas into the processing chamber and oxidizing the unit TiN film by intermittently supplying an oxidizing agent into the processing chamber multiple times is repeated multiple times.

The oxidizing agent may be supplied in a pulsed manner. The oxidizing agent may be supplied, the processing chamber is purged, and a cycle of the supply of the oxidizing agent and the purge of the processing chamber is repeated multiple times.

The Ti-containing gas is preferably $TiCl_4$ gas and the nitriding gas is preferably $NH_3$ gas. The oxidizing agent is preferably an oxygen-containing gas selected from a group consisting of $O_2$ gas, $O_3$ gas, $H_2O$ and $NO_2$ or a plasma of the oxygen-containing gas. The processing temperature ranges preferably from 300° C. to 500° C.

A storage medium stores a computer-executable program for controlling a film forming apparatus. The program, when executed on a computer, controls the film forming apparatus to perform the film forming method.

In accordance with the first aspect of the disclosure, in the initial stage of the film formation, there is executed the film forming sequence of repeating Y1 times the cycle of repeating the alternate supply of the Ti-containing gas and the nitriding gas X1 times and supplying the oxidizing agent and then repeating Y2 times the cycle of repeating the alternate supply of the Ti-containing gas and the nitriding gas X2 times and supplying the oxidizing agent until a desired film thickness. In this case, X1 and X2 are set such that the relationship X1>X2 is satisfied. Therefore, in the initial stage of the film formation in which the film hardly grows, the frequency of the oxidizing agent supply can be reduced. Accordingly, the amount of oxidation in the initial stage of the film formation can be suppressed and the smoothness of the surface of the TiON film can be prevented from deteriorating by the effect of the oxidizing agent in the initial stage of the film formation. As a result, the TiON film having good smoothness can be obtained.

In accordance with the second aspect of the disclosure, the post-flow process of the nitriding gas is performed after the unit TiN film is formed and before the unit TiN film is oxidized, so that it is possible to prevent the generation of the dangling bond in the unit TiN film and also possible to prevent oxygen in the high-k film from being taken into the TiN film during the formation of the TiON film. Accordingly, the occurrence of the oxygen vacancy in the high-k film can be reliably prevented and the leakage current can be reduced.

In accordance with the third aspect of the disclosure, the film is formed by repeating multiple times a cycle of forming the unit TiN film by alternately supplying the Ti-containing gas containing Cl and the nitriding gas with the purge process of the processing chamber interposed therebetween and oxidizing the unit TiN film by supplying the oxidizing agent and, then, the Ar ion treatment is performed on the surface of the film. Accordingly, Cl in the film can be removed by the energy of the Ar ions and, thus, the Cl concentration in the film can be reduced. Further, by performing the Ar ion treatment, the TiON film having excellent surface smoothness can be obtained.

In accordance with the fourth aspect of the disclosure, the TiON film is formed by repeating multiple times a cycle of forming the unit TiN film and oxidizing the unit TiN film by intermittently supplying the oxidizing agent into the processing chamber multiple times, so that the oxidation efficiency can be increased.

BRIEF DESCRIPTION OF THE DRAWINGS

The objects and features of the disclosure will become apparent from the following description of embodiments, given in conjunction with the accompanying drawings, in which:

FIG. 10 is a timing chart showing an example of a specific sequence of a method for forming a TiON film according to a second embodiment;

DETAILED DESCRIPTION OF THE EMBODIMENTS

Hereinafter, embodiments will be described in detail with reference to accompanying drawings.

In the following description, mL/min is used as a unit for a gas flow rate. Since, however, a volume of a gas greatly changes depending on a temperature and an atmospheric pressure, a value converted to a standard state is used in the disclosure. The flow rate converted to the standard state is generally represented by sccm (Standard Cubic Centimeter per Minutes), so that a unit of sccm is also used. The standard state used herein indicates a state in which a temperature is 0° C. (273.15 K) and an atmospheric pressure is 1 atm (101325 Pa).

First Embodiment

Figure 1:
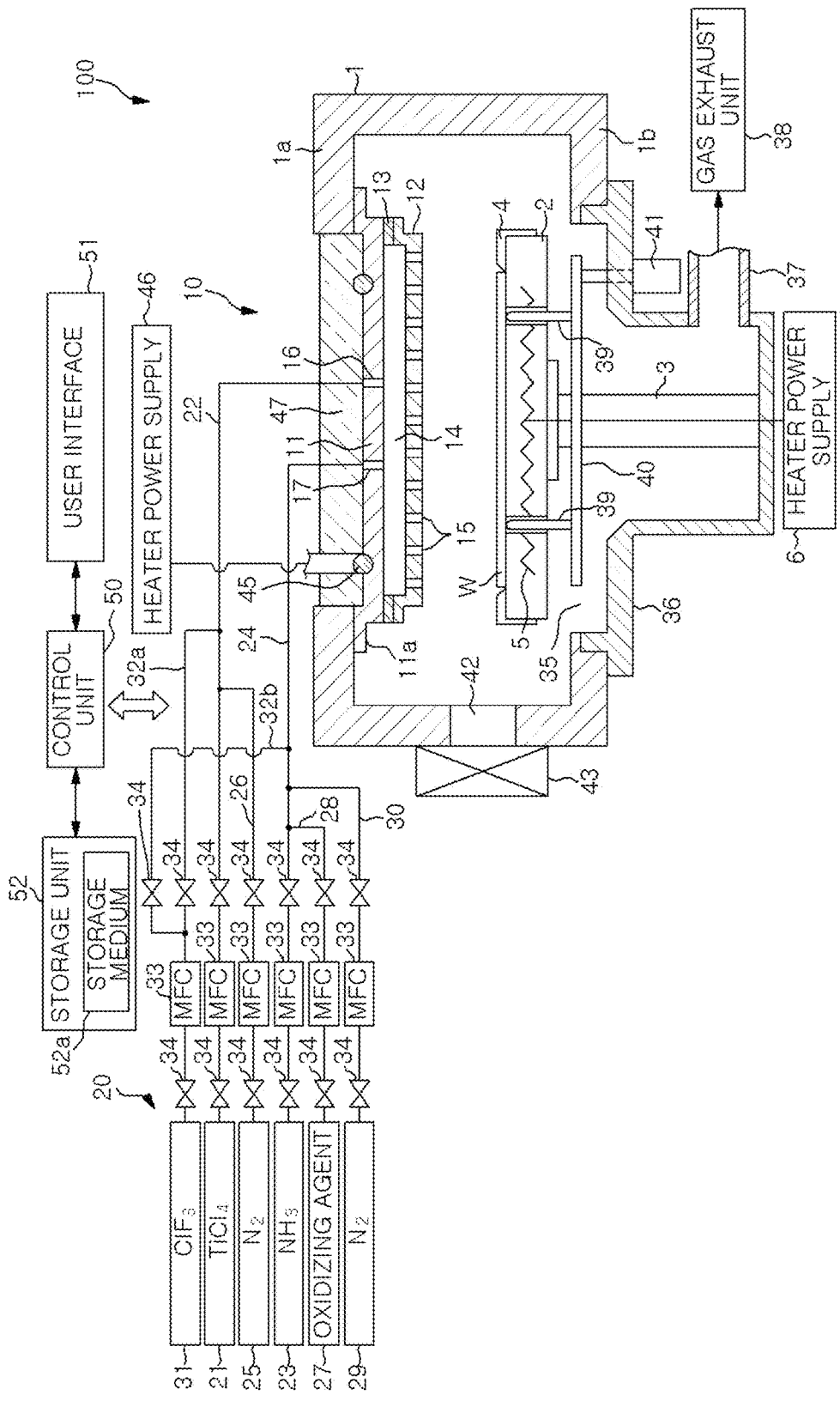
FIG. 1 is a schematic cross sectional view showing an example of a film forming apparatus used for implementing a method for forming a TiON film according to a first embodiment.

FIG. 1 is a schematic cross sectional view showing an example of a film forming apparatus used for implementing a method for forming a TiON film according to a first embodiment.

The film forming apparatus 100 includes a substantially cylindrical chamber 1. In the chamber 1, a susceptor 2 made of AlN is supported by a cylindrical supporting member 3 provided at the center of the bottom portion of the chamber 1. The susceptor 2 serves as a stage for horizontally supporting a wafer W as a substrate to be processed. A guide ring 4 for guiding a wafer W is provided at an outer peripheral portion of the susceptor 2. A heater 5 made of a high-melting point metal, e.g., molybdenum or the like, is buried in the susceptor 2. The heater 5 heats the wafer W as a substrate to be processed to a predetermined temperature by power supplied from a heater power supply 6.

A shower head 10 is provided at a ceiling wall 1a of the chamber 1. The shower head 10 includes a base member 11 and a shower plate 12. An outer peripheral portion of the shower plate 12 is fixed to the base member 11 by screws (not shown) through an annular intermediate member 13 for preventing adhesion. The shower plate 12 is formed in a flange shape and has a recess therein. A gas diffusion space 14 is formed between the base member 11 and the shower plate 12. A flange portion 11a is formed at an outer periphery of the base member 11 and held on the top wall 1a of the chamber 1. A plurality of gas injection holes 15 is formed in the shower plate 12. Two gas inlet holes 16 and 17 are formed at the base member 11.

The gas supply unit 20 includes a TiCl$_4$ gas supply source 21 for supplying TiCl$_4$ gas as a Ti-containing gas, and an NH$_3$ gas supply source 23 for supplying NH$_3$ gas as a nitriding gas. The $TiCl_4$ gas supply source 21 is connected to a $TiCl_4$ gas supply line 22. The $TiCl_4$ gas supply line 22 is connected to the first gas inlet hole 16. The $NH_3$ gas supply source 23 is connected to an $NH_3$ gas supply line 24. The $NH_3$ gas supply line 24 is connected to the second gas inlet hole.

The $TiCl_4$ gas supply line 22 is connected to a $N_2$ gas supply line 26. $N_2$ gas is supplied as a carrier gas or a purge as from the $N_2$ gas supply source 25 to the $N_2$ gas supply line 26.

The $NH_3$ gas supply line 24 is connected to an oxidizing agent supply line 28. An oxygen-containing gas such as $O_2$ gas, $O_3$ gas, $H_2O$, $NO_2$ or the like is supplied as an oxidizing agent from the oxidizing agent supply source 27 to the oxidizing agent supply line 28. A plasma of the oxygen-containing gas may be used as the oxidizing agent. At this time, the plasma of the oxygen-containing gas may be supplied as the oxidizing agent from the oxidizing agent supply source 27 or the oxygen-containing gas may be turned into a plasma in the shower head 10. The $NH_3$ gas supply line 24 is connected to an $N_2$ gas supply line. $N_2$ gas is supplied as a carrier gas or a purge gas from the $N_2$ gas supply source 29 to an $N_2$ gas supply line 30.

The gas supply unit 20 includes a $ClF_3$ gas supply source 31 for supplying $ClF_3$ gas as a cleaning gas. The $ClF_3$ gas supply source 31 is connected to a $ClF_3$ gas supply line 32a. The $ClF_3$ gas supply line 32a is connected to a $TiCl_4$ gas supply line 22. Further, a $ClF_3$ gas supply line 32b branched from the $ClF_3$ gas supply line 32a is connected to the $NH_3$ gas supply line 24.

Two valves 34 and a mass flow controller disposed therebetween are installed in each of the $TiCl_4$ gas supply line 22, the $NH_3$ gas supply line 24, the oxidizing agent line 28, the $N_2$ gas supply lines 26 and 30, and the $ClF_3$ gas supply line 32a. A valve 34 is installed in the $ClF_3$ gas supply line 32b.

Therefore, $TiCl_4$ gas from the $TiCl_4$ gas supply source 21 and $N_2$ gas from the $N_2$ gas supply source 25 reach the gas diffusion space 14 in the shower head 10 from the first gas inlet hole 16 through the $TiCl_4$ gas supply line 22. $NH_3$ gas from the $NH_3$ gas supply source 23, the oxidizing agent from the oxidizing agent supply source 27, and $N_2$ gas from the $N_2$ gas supply source 29 reach the gas diffusion space 14 in the shower head 10 from the second gas inlet hole 17 through the $NH_3$ gas supply line 24. These gases are discharged into the chamber 1 from the gas injection holes 15 of the shower plate 12.

The shower head 10 may be of a post-mix type in which $TiCl_4$ gas and $NH_3$ gas are separately supplied into the chamber 1.

As for the Ti-containing gas, tetra(isopropoxy)titanium (TTIP), titanium(IV)bromide ($TiBr_4$), titanium(IV) Iodide ($TiI_4$), tetrakisethylmethylaminotitanium (TEMAT), tetrakisdimethylaminotitanium (TDMAT), tetrakisdiethylaminotitanium (TDEAT) or the like may be used other than $TiCl_4$. As for the nitriding gas, monomethylhydrazine (MMH) may be used other than $NH_3$. As for the carrier gas and the purge gas, another inert gas such as Ar gas or the like may be used instead of $N_2$ gas.

A heater 45 for heating the shower head 10 is provided at the base member 11 of the shower head 10. The heater 45 is connected to a heater power supply 46. By supplying power from the heater power supply 46 to the heater 45, the shower head 10 is heated to a desired temperature. An insulating member 47 is provided at a recess formed at an upper portion of the base member 11 in order to increase a heating efficiency of the heater 45.

A circular opening 35 is formed at a central portion of the bottom wall 1b of the chamber 1. A gas exhaust space 36 protruding downward is provided at the bottom wall 1b to cover the opening 35. A gas exhaust line 37 is connected to a side surface of the gas exhaust space 36. The gas exhaust line 37 is connected to a gas exhaust unit 38. By operating the gas exhaust unit 38, a pressure in the chamber 1 can be decreased to a predetermined vacuum level.

Three (only two are shown) wafer supporting pins 39 for supporting and vertically moving the wafer W are provided at the susceptor 2 so as to protrude beyond and retract below the surface of the susceptor 2. The wafer supporting pins 39 are supported by a supporting table 40. The wafer supporting pins 39 are vertically moved by a driving unit 41 such as an air cylinder or the like via a supporting table 40.

Formed at a sidewall of the chamber 1 are a loading/unloading port 42 for loading and unloading the wafer W into and from a wafer transfer chamber (not shown) adjacent to the chamber 1 and a gate valve 43 for opening/closing the loading/unloading port 42.

The components of the film forming apparatus 100, i.e., the heater power supplies 6 and 46, valve 34, the mass flow controller 33, the driving unit 41 and the like, are connected to and controlled by a control unit 50 having a microprocessor (computer). The control unit 50 is connected to a user interface 51 including a keyboard through which an operator inputs a command to manage the film forming apparatus 100, a display for visually displaying an operation state of the film forming apparatus 100, or the like. Further, the control unit 50 is connected to a storage unit 52 for storing a program for executing various processed performed by the film forming apparatus 100 under the control of the control unit 50, a program, i.e., a processing recipe, for executing processes of the components of the film forming apparatus 100 under the processing condition and the like. The processing recipe is stored in a storage medium 52a of the storage unit 52. The storage medium may be a fixed medium such as a hard disk or the like, or may be a portable medium such as CDROM, DVD or the like. Alternatively, the processing recipe may be appropriately transmitted from another device through, e.g., a dedicated line. If necessary, a processing recipe may be retrieved from the storage unit 52 by an instruction from the user interface 51 and executed by the control unit 50. Accordingly, a desired process is performed in the film forming apparatus 100 under the control of the control unit 50.

The following is description on the method for forming a TiON film according to the embodiment which is performed in the film forming apparatus 100 configured as described above.

First, the chamber 1 is vacuum-evacuated by the gas exhaust unit 38 and $N_2$ gas is introduced from the $N_2$ gas supply sources 25 and 29 into the chamber 1 through the shower head 10. Also, the chamber 1 is preliminarily heated to a film forming temperature by the heater 5. When the temperature becomes stable, a TiN film is pre-coated on the inner wall of the chamber 1, the inner wall of the gas exhaust space 36, the surfaces of the components in the chamber such as the shower head 10 and the like by using $TiCl_4$ gas and $NH_3$ gas.

Upon completion of the pre-coating, the gate valve 43 is opened and the wafer W is transferred from a wafer transfer chamber (not shown) into the chamber 1 through the loading/unloading port 42 by a transfer unit (not shown) and then mounted on the susceptor 2. The wafer W is heated by the heater 5 to a predetermined temperature preferably ranging from 300° C. to 500° C. The wafer W is preliminarily heated by supplying $N_2$ gas into the chamber 1. When the temperature of the wafer becomes stable, the formation of the TiON film is started.

The method for forming a TiON film of the present embodiment is based on the film forming method of repeating multiple times (Y times) a cycle of alternately supplying $TiCl_4$ gas as a Ti-containing gas and $NH_3$ gas as a nitriding gas with a process of purging an inside of the chamber 1 interposed therebetween multiple times (X times), supplying the oxidizing agent, and purging the chamber 1.

An example of a sequence of the film forming technique that is the base of the present embodiment will be described with reference to the timing chart of FIG. 2 and the flowchart of FIG. 3.

As can be seen from the drawings, first, $TiCl_4$ gas is supplied from the $TiCl_4$ gas supply source 21 into the chamber 1 to be adsorbed (step S1). Next, the supply of $TiCl_4$ gas is stopped and the chamber 1 is purged by $N_2$ gas (step S2). Then, $NH_3$ gas is supplied from the $NH_3$ gas supply source 23 into the chamber 1 and made to react with the adsorbed $TiCl_4$, thereby forming TiN (step S3). Thereafter, the supply of $NH_3$ gas is stopped and the chamber 1 is purged by $N_2$ gas (step S4). The steps S1 to S4 are repeated X times. Then, an oxidation process is performed by supplying an oxidizing agent (e.g., $O_2$ gas) from the oxidizing agent supply source 27 into the chamber 1 (step S5). Next, the chamber 1 is purged (step S6). By repeating Y times a cycle of repeating the steps S1 to S4 X times, the step S5 and the step S6, a TiON film having a desired thickness is obtained.

Figure 4:
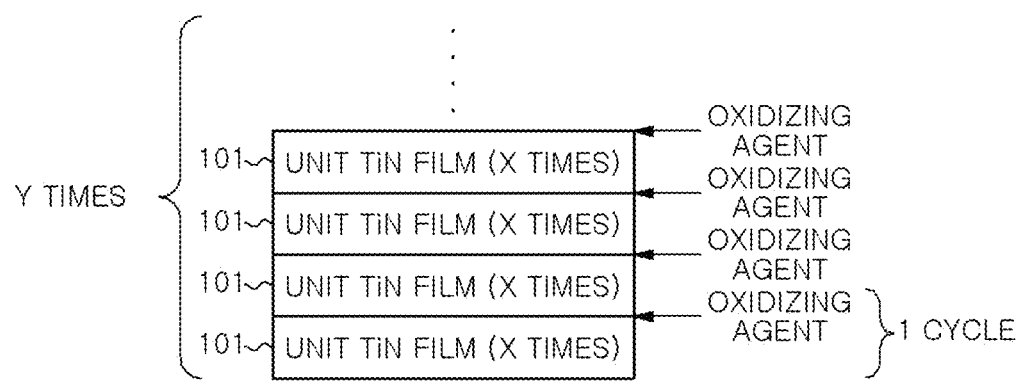
FIG. 4 schematically shows a film forming state in the case of forming a TiON film by the sequence shown in FIG. 3.

The state of the formed film at this time is shown in FIG. 4. As can be seen from FIG. 4, a unit TiN film 101 having a predetermined thickness is formed by repeating the steps S1 to S4 X times and, then, the unit TiN film 101 is oxidized by performing an oxidizing process in the step S5 and the chamber 1 is purged in the step S6. By repeating Y times such a cycle, a TiON film having a predetermined film thickness is formed. At this time, the amount of oxygen in the TiON film can be controlled by X, i.e., the number of repetition of the steps S1 to S4. In other words, when X is decreased, the frequency of oxidation is increased and, thus, the oxygen concentration in the film is increased. On the contrary, when X is increased, the oxygen concentration in the film is decreased. The film thickness can be controlled by the number of repetition Y of repeating the steps S1 to S4 and then executing the steps S5 and S6.

Figure 5:
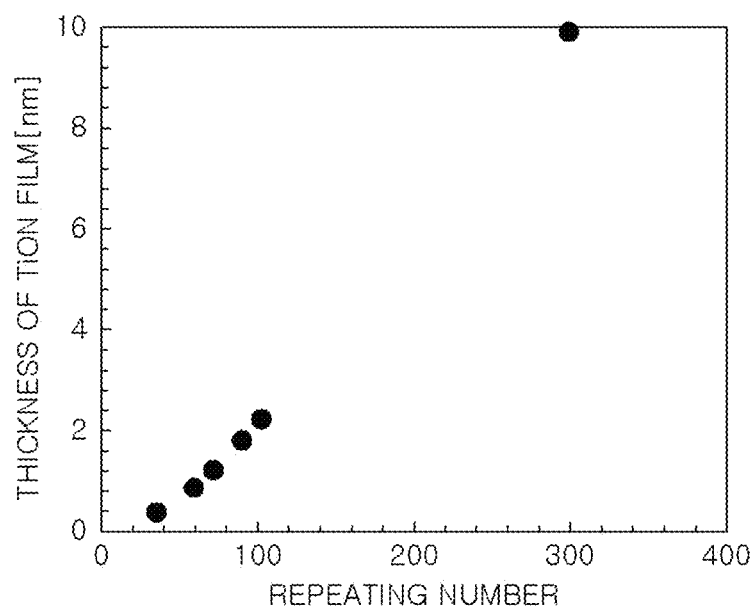
FIG. 5 shows relation between a film thickness and the number of cycles in the case of setting X to 6 in the film forming technique that is the base of the embodiment.

FIG. 5 shows relation between a film thickness and the number of cycles in the case of forming a TiON film on an oxide film by the basic film forming technique while fixing X to 6 by using the apparatus shown in FIG. 1. The number of cycles is obtained by multiplying X and Y. As shown in FIG. 5, the state in which the film does not grow (film formation delay) is maintained in an initial stage of the film formation. Therefore, if X is constant, the amount of oxidation becomes excessive compared to the actual film formation amount in the initial stage of the film formation. If the amount of oxidation is increased in the initial stage of the film formation, the base film is affected by the oxidizing agent, which may lead to poor surface smoothness of the TiON film.

Therefore, in the present embodiment, the number of repetition of the steps S1 to S4 in the initial stage of the film formation is set to be greater than that of the steps S1 to S4 in the later stage of the film formation. In other words, on the assumption that the number of repetition of the steps S1 to S4 in the initial stage of the film formation is X1 and the number of repetition of the steps S1 to S4 in the later stage of the film formation is X2, X1 is set to be greater than X2.

Figure 6:
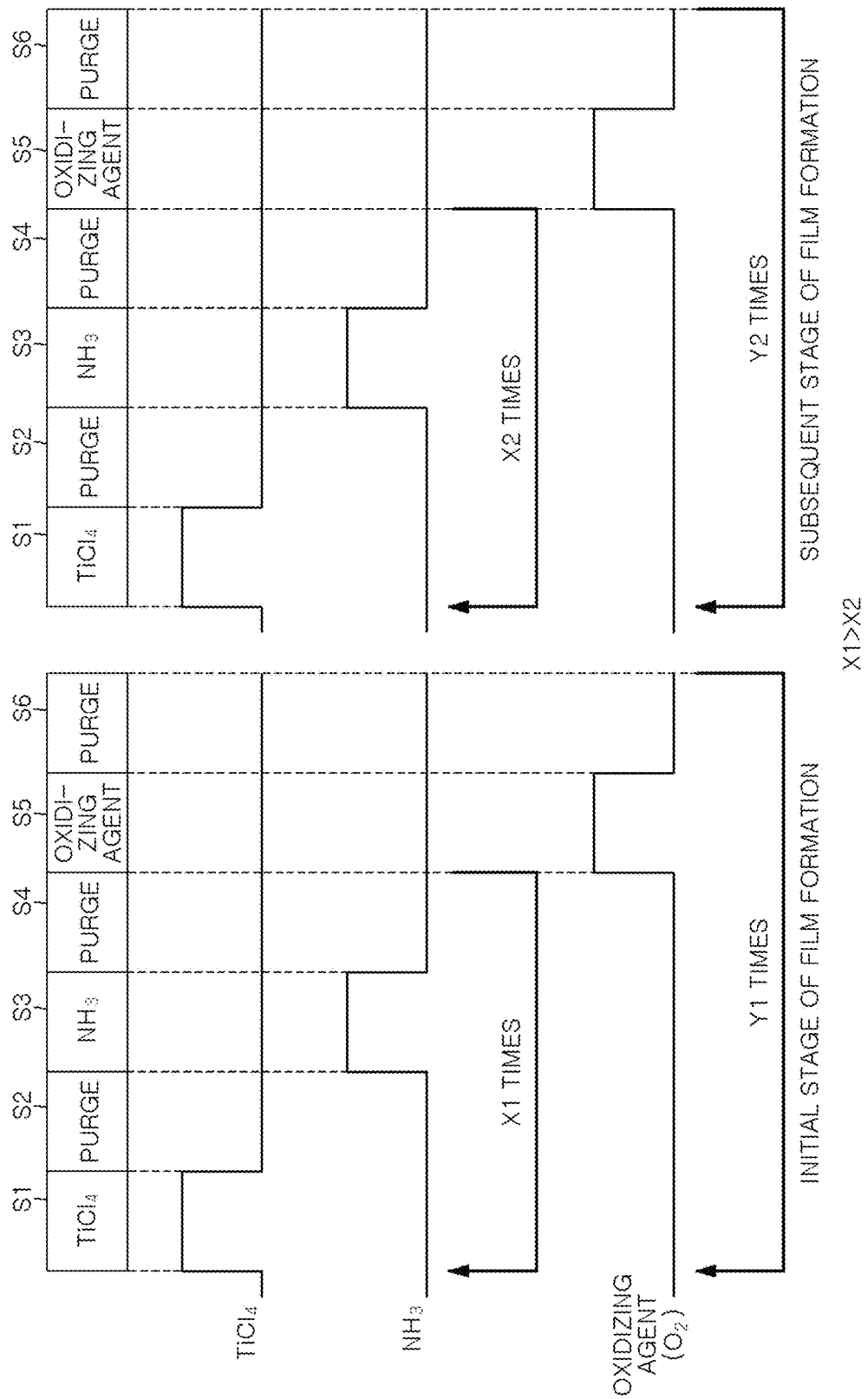
FIG. 6 is a timing chart showing an example of a sequence of a method for forming a TiON film according to the embodiment)

Specifically, as can be seen from the timing chart of FIG. 6, in the initial stage of the film formation, a cycle of repeating the steps S1 to S4 X1 times which is larger than the normal repetition and then executing the step S5 that is an oxidizing agent supply step and the step S6 that is a purge step is executed Y1 times. Then, in the later stage of the film formation, a cycle of repeating the steps S1 to S4 X2 times (X2 being smaller than X1) and then executing the step S5 that is the oxidizing agent supply step and the step S6 that is the purge step is executed Y2 times. In other words, X indicating the number of repetition of the steps S1 to S4 is changed during the film formation. A film thickness of the TiON film is determined by the sum of Y1 and Y2.

Thus, the frequency of the step S5 that is the oxidizing agent supply step can be reduced in the initial stage of the film formation in which the film hardly grows. Accordingly, the amount of oxidation in the initial stage of the film formation can be suppressed and deterioration of the surface smoothness of the TiON film by the effect of the oxidizing agent in the initial stage of the film formation is suppressed. As a result, the TiON film having excellent smoothness can be obtained. When the film formation state becomes normal after the initial stage of the film formation in which the film hardly grows, a desired amount of oxidation with respect to the amount film formation can be obtained by reducing the number of repetition of the steps S1 to S4 from X1 to X2. Further, the oxygen concentration in the entire TiON film can be adjusted by controlling the oxidation time or the flow rate of the oxidizing agent.

In this case, the number of repetition X2 of the steps S1 to S4 in the normal state is set such that the desired amount of oxidation (oxygen concentration) in the TiON film is obtained. Preferably, X2 satisfies $1 \leq X2 \leq 25$. The number of repetition X1 of the steps S1 to S4 in the initial stage is preferably at least three times greater than X2. Preferably, X1 satisfies $10 \leq X1 \leq 60$. The number of repetition Y1 in the initial stage of the film formation may be set to cover the period of the film-forming delay in which the film does not grow. Preferably, Y1 satisfies $1 \leq Y1 \leq 5$. The number of repetition Y2 is appropriately determined depending on a film thickness of a TiON film to be formed.

After the TiON film is formed as described above, the chamber 1 is vacuum-evacuated and the wafer W is unloaded.

In the case of using $TiCl_4$ gas as a Ti source gas, $NH_3$ gas as a nitriding gas, $N_2$ gas as a carrier gas·purge gas, and $O_2$ gas as an oxidizing agent, desired ranges of the film forming conditions are as follows.

Processing temperature (susceptor temperature): 300 to 500° C.
Pressure in chamber: 13.33 to 1333 Pa (0.1 to 10 Torr)
$TiCl_4$ gas flow rate: 10 to 200 mL/min (sccm)
$NH_3$ gas flow rate: 1000 to 10000 mL/min (sccm)
$N_2$ gas flow rate: 1000 to 30000 mL/min (sccm)
Duration of steps 1 to 4: 0.01 to 3 sec
$O_2$ gas flow rate: 10 to 3000 mL/min (sccm)
$O_2$ gas supply period: 0.1 to 60 sec Next, the surface smoothness of the TiON films formed by the process in which X is fixed (X fixed process) and the process in which X is varied according to the present embodiment (X-varying process) were compared. In this case, the TiON films were formed by using $TiCl_4$ gas as a Ti source gas, $NH_3$ gas as a nitriding gas, $N_2$ gas as a carrier gas·purge gas, and $O_2$ gas as an oxidizing agent under the above-described conditions. Specifically, in the X fixed process, the TiON film was formed while fixing X to 6 and controlling the film thickness by Y. In the X varying process, the TiON film was formed while setting X1 to 30, Y1 to 1 and X2 to 6 and controlling the film thickness by Y2. The film formation temperature was set to 430° C. in both processes. The surface smoothness was evaluated by Haze. Haze is an index of light diffusion and expresses a ratio of diffused transmitted light to the total transmitted light. Haze is related to the surface roughness. As the value of Haze becomes smaller, the surface smoothness becomes good. As the value of Haze becomes greater, the surface smoothness becomes poor.

Figure 7:
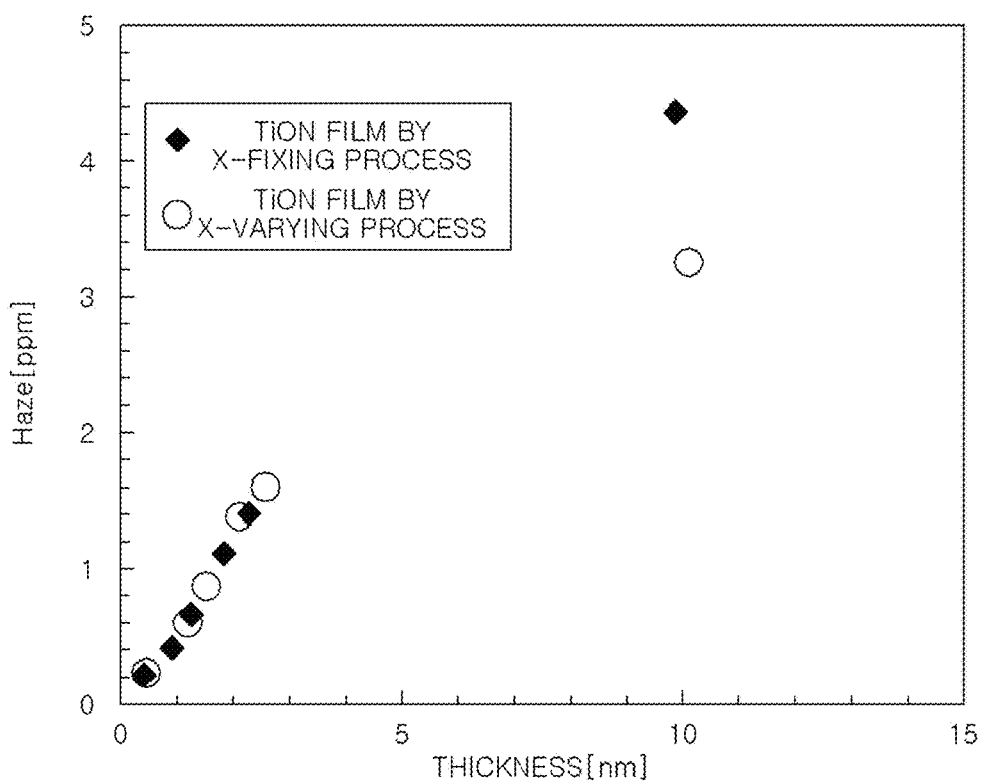
FIG. 7 shows relation between a Haze and film thicknesses of a TiON film formed by a process in which X is fixed and a TiON film formed by a process in which X varies according to the embodiment.

The result thereof is shown in FIG. 7. FIG. 7 shows relationship between Haze and film thicknesses of the TiON films formed by the X fixed process and the X varying process. As can be seen from FIG. 7, in the initial stage of the film formation, there is no great difference in the value of Haze between the X fixed process and the X varying process. However, when the film thickness is 10 nm, the value of Haze becomes smaller in the X varying process. In other words, it is clear that the smoothness of the TiON film becomes better in the case where X is varied as in the present embodiment than in the case where X is fixed.

Figure 8:
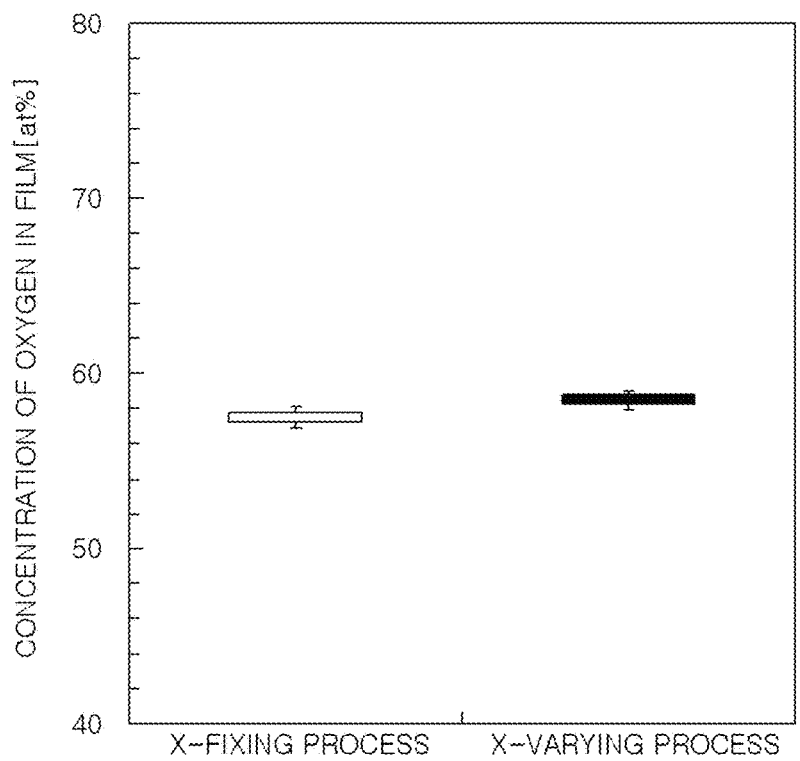
FIG. 8 shows a result of measuring concentration of oxygen in a TiON film formed by a process in which X is fixed and in a TiON film formed by a process in which X varies according to the embodiment.

Next, the effect of the frequency of oxidation on the oxygen concentration in the film in the initial stage of the film formation was examined. In this case, the oxygen concentration was measured at 9 points on the wafer by X-ray photoelectron spectroscopy (XPS) and the average thereof was calculated as the oxygen concentration in the film. The result thereof is shown in FIG. 8. As can be seen from FIG. 8, the oxygen concentration in the film is hardly different between the X fixed process in which X is fixed and the X varying process of the present embodiment.

Second Embodiment

Hereinafter, a second embodiment will be described.

In the second embodiment, a TiON is formed by using the film forming apparatus 100 shown in FIG. 1 by a technique in which nitriding is enhanced compared to the first embodiment.

Hereinafter, an example of the TiON film forming method of the present embodiment will be described.

First, a pre-coating process is performed as in the first embodiment. Then, the gate valve 43 is opened and a wafer W is unloaded from a wafer transfer chamber (not shown) and loaded into the chamber 1 through the loading/unloading port 42 by a transfer unit (not shown). Next, the wafer W is mounted on the susceptor 2. The wafer W is heated by the heater 5 to a predetermined temperature preferably ranging from 300° C. to 500° C. The wafer W is preliminarily heated by the heater 5 while supplying $N_2$ gas into the chamber 1. When the temperature of the wafer becomes almost stable, TiON film formation is started.

Figure 2:
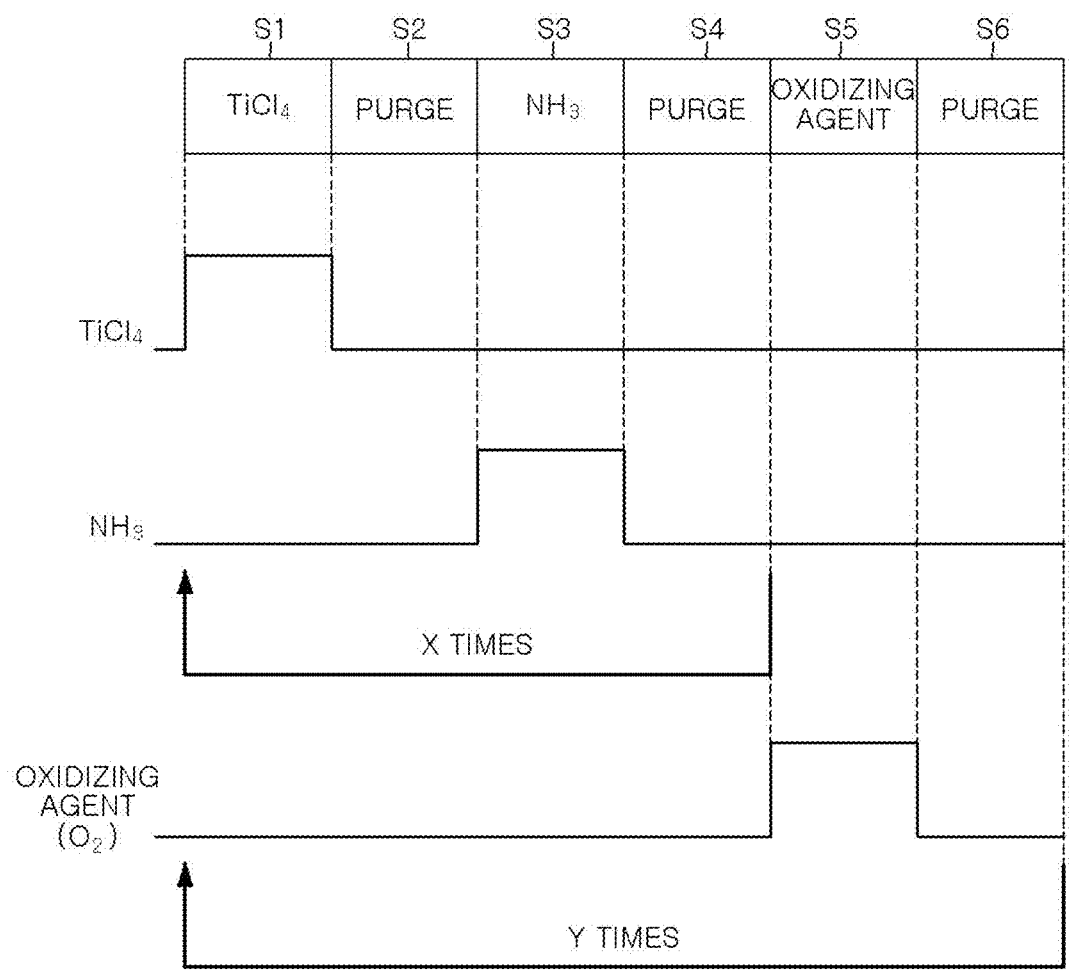
FIG. 2 is a timing chart showing an example of a sequence of a film forming technique that is the base of the method for forming a TiON film according to the first embodiment.
Figure 3:
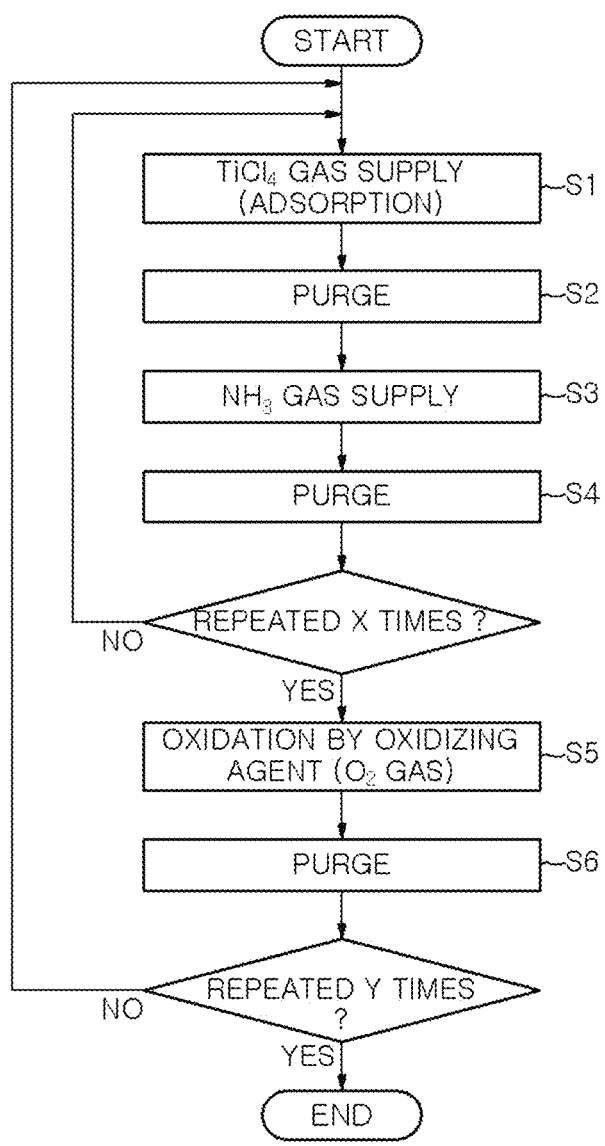
FIG. 3 is a flowchart showing the example of the sequence of the film forming technique that is the base of the method for forming a TiON film according to the first embodiment.

In forming the TiON film, if the aspect ratio is increased as the miniaturization of the devices progresses, e.g., as an opening of a capacitor structure of a DRAM becomes narrower, reduction of $TiCl_4$ at a bottom (cylinder bottom) of a via may not be sufficient in the sequence of FIG. 2 which is the base of the first embodiment. When the reduction is insufficient, chlorine is separated from $TiCl_4$ by the following reaction (1). However, the nitriding of Ti by the following reaction (2) may not be sufficient.

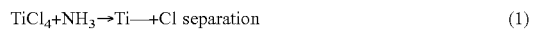

$$TiCl_4 + NH_3 \rightarrow Ti\text{---}+Cl \text{ separation} \qquad (1)$$

$$Ti\text{---}+NH_3 \rightarrow TiN \text{ nitriding} \qquad (2)$$

When the reaction (1) occurs but the reaction (2) is insufficient, a Ti dangling bond that is not coupled with N exists at the TiN film before oxidation. Since the dangling bond is active, it readily reacts with oxygen in the high-k film adjacent thereto even during the film formation and, thus, oxygen vacancy occurs in the high-k film. When oxygen vacancy (Vo) occurs in the high-k film, a leakage current due to PF (Poole-Frenkel) conduction occurring through the vacancy is increased.

Figure 9A:
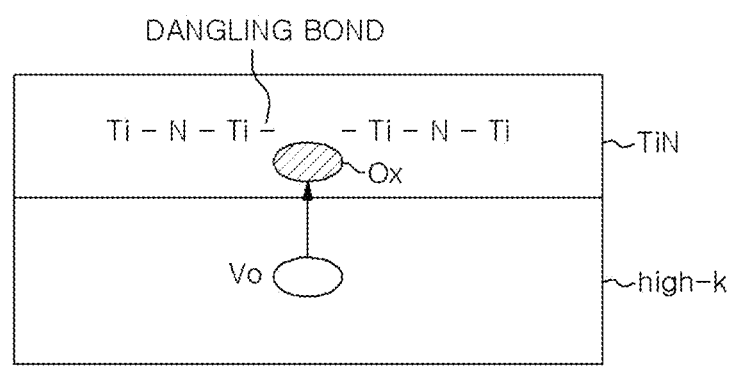
FIG. 9A shows mechanism in which oxygen vacancy occurs in a high-k film adjacent to a TiN film before oxidation where a dangling bond is generated and FIG. 9B shows mechanism in which oxygen vacancy does not occur in a high-k film adjacent to a TiN film by a post flow of a nitriding gas.
Figure 9B:
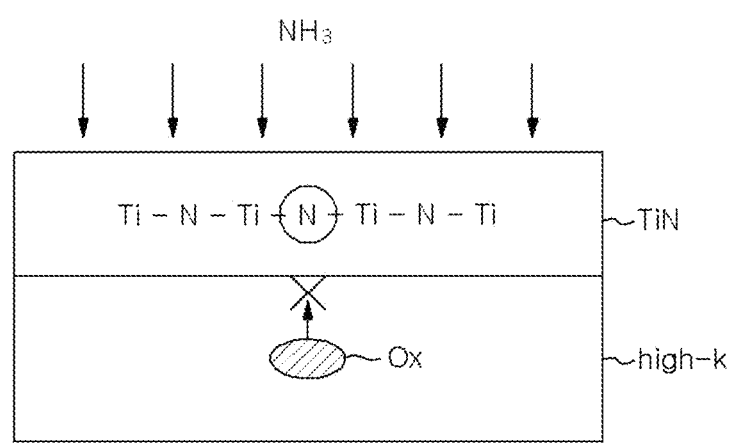

Thus, in the present embodiment, a step of supplying $NH_3$ gas is added between the formation of the unit TiN film and the oxidation process. Accordingly, as shown in FIG. 9B, it is possible to avoid generation of a dangling bond in the unit TiN film and also possible to prevent oxygen in the high-k film from being taken into the TiN film during the formation of the TiON film.

An example of a specific sequence will be described with reference to the timing chart of FIG. 10 and the flowchart of FIG. 11.

Figure 11:
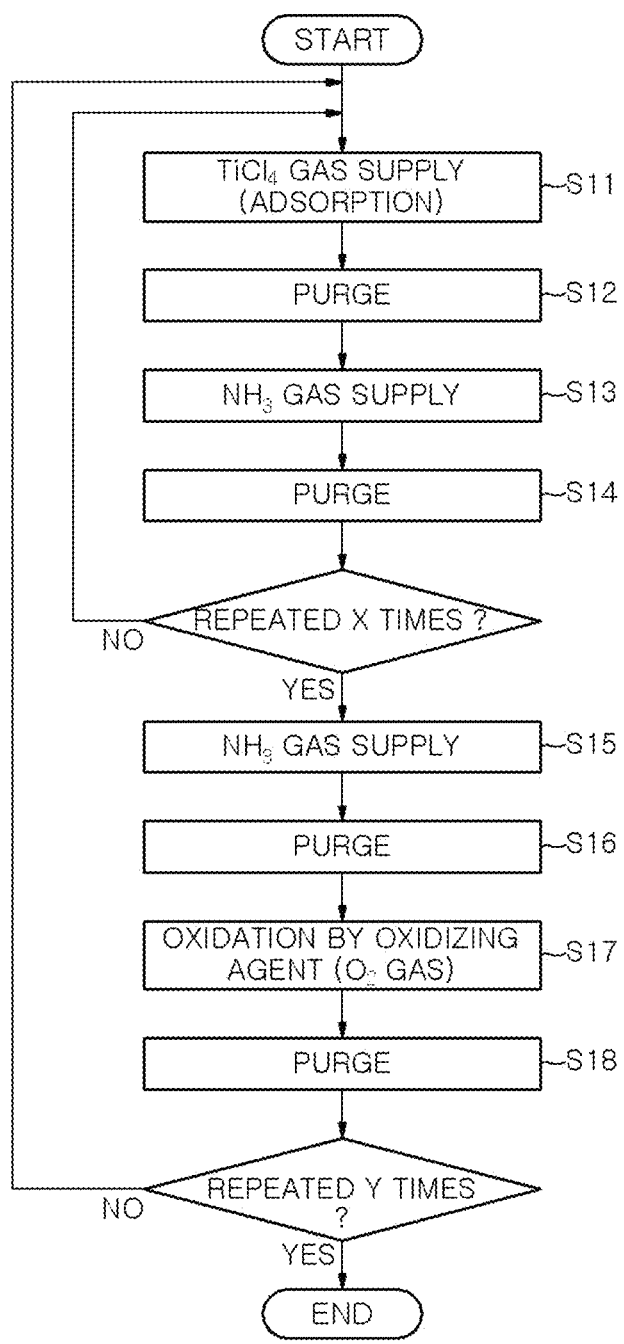
FIG. 11 is a flowchart showing the example of the specific sequence of the method for forming a TiON film according to the second embodiment.

As can be seen from FIGS. 10 and 11, first, as in the steps S1 to S4 of the first embodiment, $TiCl_4$ gas is supplied from the $TiCl_4$ gas supply source 21 into the chamber 1 to be adsorbed (step S11). Next, the supply of $TiCl_4$ gas is stopped and the chamber 1 is purged by $N_2$ gas (step S12). Then, $NH_3$ gas is supplied from the $NH_3$ gas supply source 23 into the chamber 1 and made to react with the adsorbed $TiCl_4$, thereby forming TiN (step S13). Thereafter, the supply of $NH_3$ gas is stopped and the chamber 1 is purged by $N_2$ gas (step S14). The steps S11 to S14 are repeated X times. Next, a post flow process of $NH_3$ gas is performed by supplying $NH_3$ gas from the $NH_3$ gas supply source 23 into the chamber 1 (step S15). Then, the supply of $NH_3$ gas is stopped and the chamber 1 is purged by $N_2$ gas (step S16). Thereafter, an oxidation process is performed by supplying an oxidizing agent (e.g., $O_2$ gas) into the chamber 1 from the oxidizing agent supply source 27 (step S17). Next, the chamber 1 is purged (step S18). By repeating Y times a cycle of repeating the steps S11 to S14 X times and the steps S15 to S18, a TiON film having a desired thickness is formed.

At this time, the amount of oxygen in the TiON film can be controlled by the number of repetition X of the steps S11 to S14. In other words, when the number of repetition X is decreased, the frequency of oxidation is increased and, thus, the concentration of oxygen in the film is increased. On the contrary, when the number of repetition X is increased, the concentration of oxygen in the film is decreased. The film thickness can be controlled by the number of repetition Y. The concentration of oxygen in the TiON film can also be controlled by the oxidation time or the flow rate of the oxidizing agent as well as by the number of repetition of the steps S11 to S14.

After the TiON film is formed as described above, the chamber 1 is vacuum-evacuated and the wafer W is unloaded.

Since the post flow of $NH_3$ gas of the step 15 is added before the oxidation process of the step 17, it is possible to avoid generation of a dangling bond in the unit TiN film and also possible to prevent oxygen in the high-k film from being taken into the TiN film during the TiON film formation. Accordingly, the occurrence of oxygen vacancy in the high-k film can be more reliably prevented and the leakage current can be reduced. Such an effect is effective particularly in the case where the via bottom (cylinder bottom) may not be sufficiently reduced by only the alternate supply of $NH_3$ gas, as in the case of a DRAM capacitor having a very fine structure. However, the present embodiment is not limited to the above case and may also be applied to any case of forming a TiON film near a high-k film.

In the present embodiment, as for the oxidizing agent, an oxygen-containing gas such as $O_2$ gas, $O_3$ gas, $H_2O$, $NO_2$ or the like may be used. Or, a plasma of an oxygen-containing gas may be used as the oxidizing agent. As for the Ti-containing gas, tetra(isopropoxy)titanium (TTIP), titanium(IV)bromide ($TiBr_4$), titanium(IV)Iodide ($TiI_4$), tetrakisethylmethylaminotitanium (TEMAT), tetrakisdimethylaminotitanium (TDMAT), tetrakisdiethylaminotitanium (TDEAT) or the like may be used other than $TiCl_4$. As for the nitriding gas, monomethylhydrazine (MMH) may be used other than $NH_3$. As for the carrier gas and the purge gas, another inert gas such as Ar gas or the like may be used instead of $N_2$ gas.

In the case of using $TiCl_4$ gas as a Ti source gas, $NH_3$ gas as a nitriding gas, $N_2$ gas as a carrier gas·purge gas, and $O_2$ gas as an oxidizing agent, desired ranges of the film forming conditions are as follows.

Processing temperature (susceptor temperature): 300 to 500° C.
Pressure in chamber: 13.33 to 1333 Pa (0.1 to 10 Torr)
$TiCl_4$ gas flow rate: 10 to 200 mL/min (sccm)
$NH_3$ gas flow rate: 1000 to 10000 mL/min (sccm)
$N_2$ gas flow rate: 1000 to 30000 mL/min (sccm)
Duration of steps 11 to 16: 0.01 to 3 sec
$O_2$ gas flow rate: 10 to 3000 mL/min (sccm)
$O_2$ gas supply period: 0.1 to 60 sec In the above example, the post flow of $NH_3$ gas was executed only once. However, the flow process of $NH_3$ gas and the purge process may be repeated twice or more in a pulsed manner.

The post flow of the nitriding gas before the oxidation process in the present embodiment may be applied to the TiON film forming method of the first embodiment. In that case as well, the same effect can be obtained.

Third Embodiment

Hereinafter, a third embodiment will be described.

In the third embodiment, a TiON film is formed by the film forming apparatus 100 shown in FIG. 1 by the sequence shown in FIG. 2 which is the base of the first embodiment and, then, Ar ion treatment is performed on the surface of the film.

Figure 12:
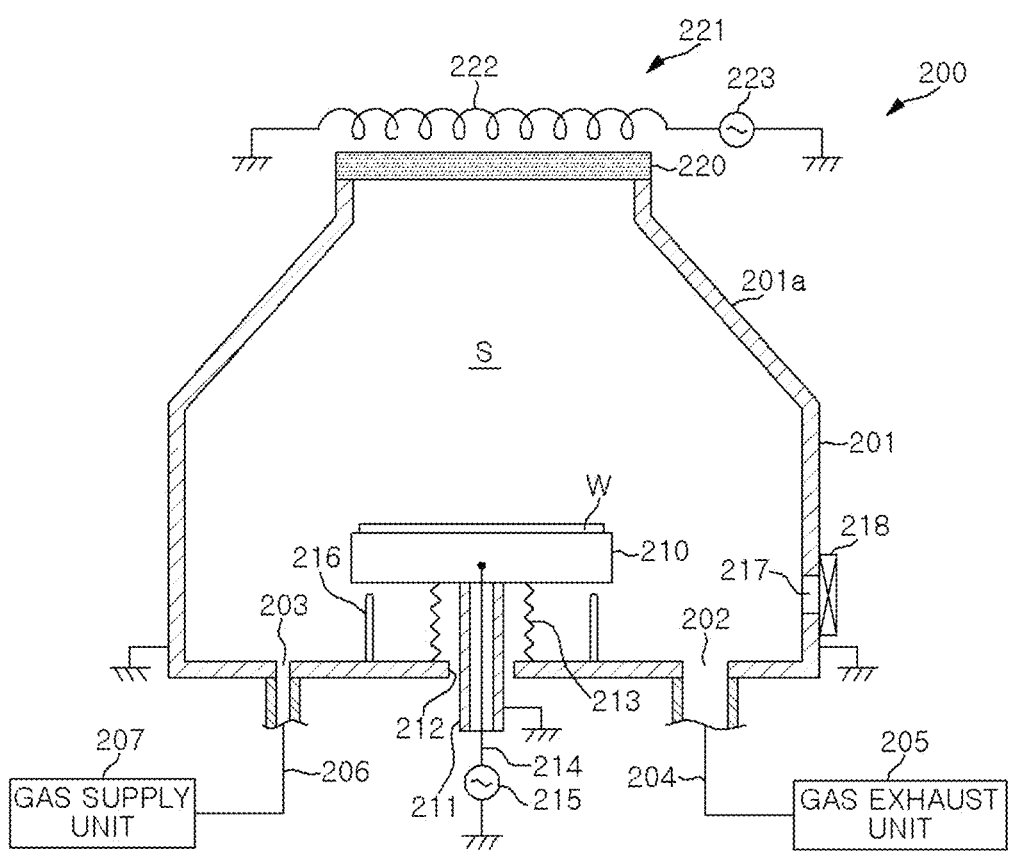
FIG. 12 is a cross sectional view showing an example of an Ar ion processing apparatus used for implementing the method for forming a TiON film according to a third embodiment.

FIG. 12 is a cross sectional view showing an example of an Ar ion treatment apparatus.

Here, an ICP (Inductively Coupled Plasma) type plasma sputtering apparatus is used as the Ar ion treatment apparatus.

As shown in FIG. 12, an Ar ion treatment apparatus 200 includes a chamber 201 that is grounded and made of a metal such as aluminum or the like. A gas exhaust port 202 and a gas inlet port 203 are provided at a bottom portion of the chamber 202. A gas exhaust line 204 is connected to the gas exhaust port 202. A gas exhaust unit 205 including a throttle valve for pressure control, a vacuum pump or the like is connected to the gas exhaust line 204. A gas supply line 206 is connected to the gas inlet port 203. A gas supply unit 207 for supplying another gas such as Ar gas, $N_2$ gas or the like is connected to the gas supply line 206. A stage 210 is made of a conductive material and grounded via a support 211.

The stage 210 for mounting thereon a wafer W that is a target substrate is provided in the chamber 201. The stage 210 is provided with a temperature control unit (not shown) for controlling a temperature of a wafer attracting electrostatic chuck (not shown) and a temperature of the wafer. The cylindrical support 211 is provided at a central portion of a bottom surface of the stage 210. A lower portion of the support 211 extends downward through an insertion hole 212 formed at a central portion of the bottom portion of the processing chamber 201. The support 211 is vertically moved by an elevation unit (not shown), and the stage 210 is vertically moved by the vertical movement of the stage 211. Between the stage 210 and the bottom portion of the chamber 201, a bellows 213 is provided to surround the support 211. A power feed line 214 is connected to the stage 210 and extends downward through the inner space of the support 211. A high frequency bias power supply 215 is connected to the power feed line 214. A high frequency bias power having a frequency of, e.g., 13.56 MHz, is applied from the high frequency bias power supply 215 to the wafer W via the stage 210.

A plurality of, e.g., three (only two are shown), support pins 216 are uprightly mounted on the bottom portion of the chamber 20. The support pins 216 are inserted into pin insertion holes (not shown) formed at the stage 210. When the stage 210 is lowered, the wafer W can be transferred while being supported at the upper ends of the support pins 216.

A loading/unloading port 217 for loading/unloading the wafer W is provided at a lower sidewall of the chamber 201. The loading/unloading port 217 is opened/closed by a gate valve 218.

A transmitting plate 220 made of a dielectric material is airtightly provided at a ceiling portion of the chamber 201. A plasma generation source 221 for generating a plasma of Ar gas in a processing space S in the chamber 201 is provided at a top surface side of the transmitting plate 220. The plasma generation source 221 includes an induction coil 222 provided along the top surface of the transmitting plate 220, and a high frequency power supply for plasma generation 223 connected to the induction coil 222. By applying a high frequency power of, e.g., 13.56 MHz, from the high frequency power supply for plasma generation 223 to the induction coil 222, an induced electric field is generated in the processing space S through the transmitting plate 220.

An inclined portion 201a is formed at an upper portion of the chamber 201. Installed at an inner side thereof is an annular target having an inwardly inclined cross sectional shape (truncated cone shape). Although there are provided a DC power supply (not shown) for applying a DC voltage to the target and a magnet (not shown) installed at an outer peripheral side of the target, the description thereof will be omitted because they are not required in the case of using the Ar ion treatment apparatus.

The Ar ion processing apparatus 200 includes a control unit (not shown) same as the control unit 50 of the film forming apparatus 100. Components of the Ar ion processing apparatus 200 are connected to and controlled by the control unit.

In the Ar ion processing apparatus 200 configured as described above, an Ar plasma is generated in the processing space S in the chamber 201 by supplying Ar gas from the gas supply unit 207 into the chamber 201 and applying the high frequency power from the high frequency power supply 223 to the induction coil 222. Further, Ar ions are attracted to the wafer W by applying the high frequency bias power from the high frequency bias power supply 215 to the stage 210, thereby performing Ar ion treatment on the surface of the wafer W.

Hereinafter, an example of the TiON film forming method of the present embodiment will be described.

Figure 13:
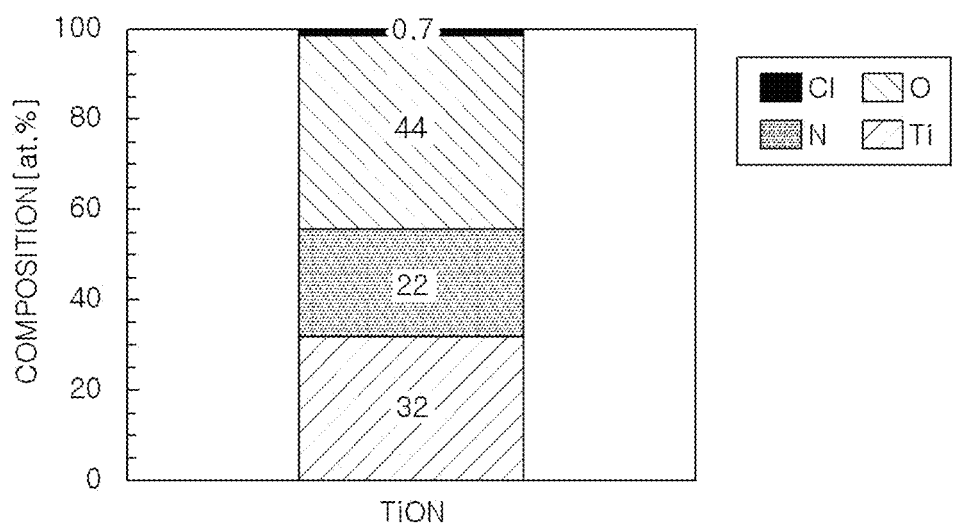
FIG. 13 shows a composition of a TiON film formed by the technique shown in FIG. 2.
Figure 14:
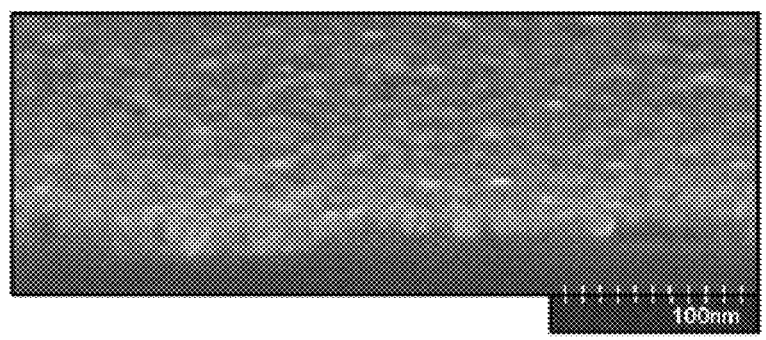
FIG. 14 shows an SEM image of a surface of the TiON film formed by the technique shown in FIG. 2.

In forming the TiON film, if a technique for repeating a cycle of forming a unit TiN film by alternately supplying TiCl₄ gas and NH₃ gas and then performing an oxidation process as shown in FIG. 2 is used, Cl of about 0.7 at. % remains in the film as shown in FIG. 13 and the smoothness becomes poor as shown in FIG. 14. This is because TiCl₄ as a source gas is not completely reduced and Cl remains in the film. FIG. 13 shows a result of measuring a composition of the TiON film by using XPS. FIG. 14 is an SEM image of the surface of the TiON film.

Therefore, in the present embodiment, the TiON film is formed by the sequence shown in FIG. 2 and, then, the Ar ion treatment is performed so that the remaining Cl is reduced.

Figure 15:
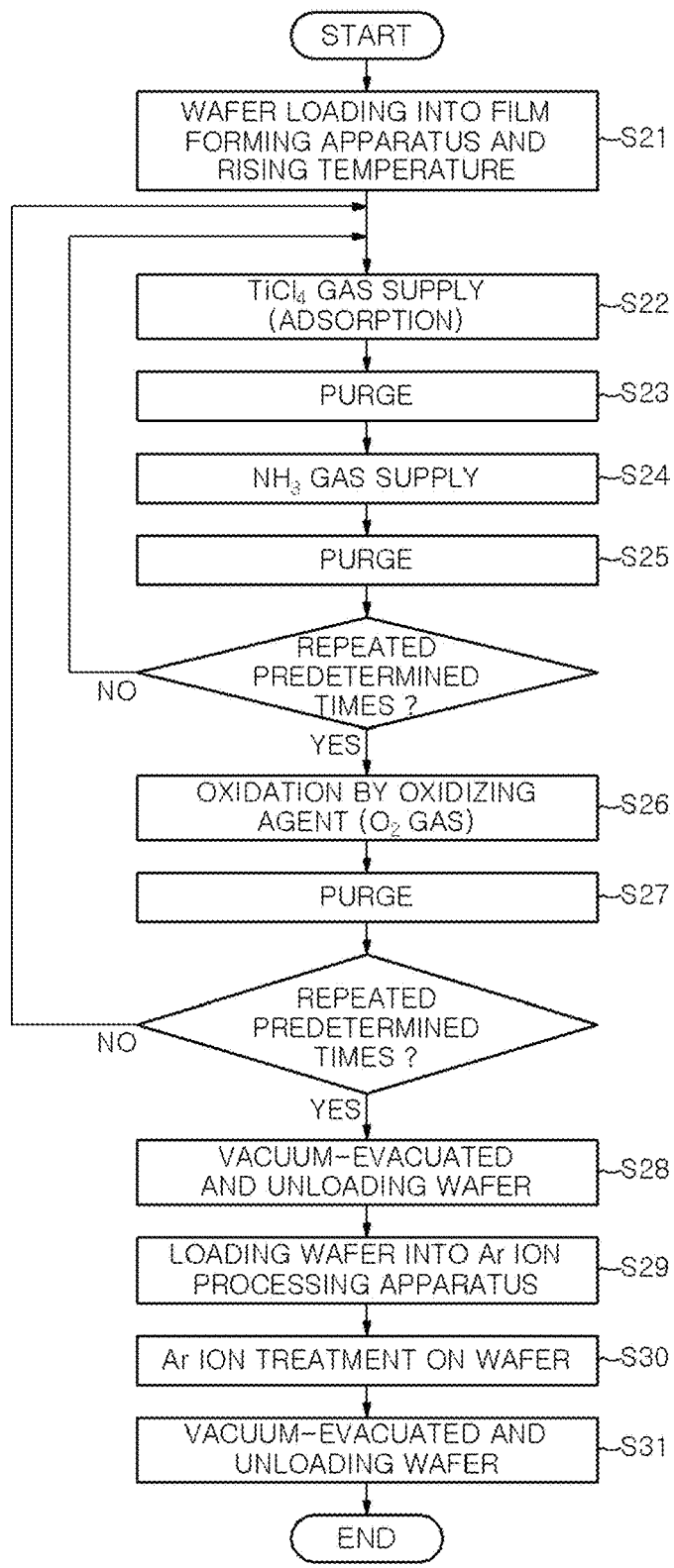
FIG. 15 is a flowchart showing an exemplary flow of the method for forming a TiON film according to the third embodiment.

A specific flow will be described with reference to the flowchart of FIG. 15.

First, as in the first embodiment, the wafer W is loaded into the chamber 1 that has been subjected to the pre-coating process by the film forming apparatus 100 through the loading/unloading port 42. Then, the wafer W is mounted on the susceptor 2. Next, the wafer W is heated by the heater 5 to a predetermined temperature preferably ranging from 300° C. to 500° C. The temperature of the wafer W is stabilized by preliminarily heating the wafer W by the heater 5 while supplying N₂ gas into the chamber 1 (step S21).

Then, as in the steps S1 to S4 of the first embodiment, TiCl₄ gas is supplied from the TiCl₄ gas supply source 21 into the chamber 1 to be adsorbed (step S22). Next, the supply of TiCl₄ gas is stopped and the chamber 1 is purged by N₂ gas (step S23). Then, NH₃ gas is supplied from the NH₃ gas supply source 23 into the chamber 1 and made to react with the adsorbed TiCl₄, thereby forming TiN (step S24). Thereafter, the supply of NH₃ gas is stopped and the chamber 1 is purged by N₂ gas (step S25). The steps S22 to S25 are repeated a predetermined number of times. Then, an oxidation process is performed by supplying an oxidizing agent (e.g., O₂ gas) from the oxidizing agent supply source 27 into the chamber 1 (step S26). Next, the chamber 1 is purged (step S27). By repeating a predetermined number of times a cycle of repeating the steps S22 to S25 a predetermined number of times, the step S26 and the step S27, a TiON film having a desired thickness is obtained.

At this time, the amount of oxygen in the TiON film can be controlled by the number of repetition of the steps S22 to S25. In other words, when the number of repetition is decreased, the frequency of oxidation is increased and, thus, the concentration of oxygen in the film is increased. On the contrary, when the number of repetition is increased, the concentration of oxygen in the film is decreased. The film thickness can be controlled by the number of cycles. The concentration of oxygen in the TiON film can also be controlled by the oxidation time or the flow rate of the oxidizing agent as well as by the number of repetition of the steps S22 to S25.

After the TiON film is formed as described above, the chamber 1 is vacuum-evacuated and the wafer W is unloaded from the chamber 1 (step S28).

Next, the wafer W having the TiON film is loaded into the chamber 201 of the Ar ion processing apparatus 200 and mounted on the stage 210 (step S29). Then, the chamber 201 is vacuum-evacuated to a high vacuum of 10⁻⁶ Pa order. Thereafter, a pressure in the chamber 201 is controlled to a predetermined level by supplying Ar gas into the chamber 201. An Ar plasma is generated in the processing space S in the chamber 201 by applying the high frequency power from the high frequency power supply 223 to the induction coil 222. Further, Ar ions are attracted to the wafer W by applying the high frequency bias power from the high frequency bias power supply 215 to the stage 210. As a consequence, the Ar ion treatment is performed on the surface of the wafer W (step S30).

After the Ar ion processing is completed, the chamber 201 is vacuum-evacuated and the wafer W is unloaded from the chamber 201 (step S31).

In the present embodiment, the plasma is generated in the chamber 201 and the wafer W is processed by attracting Ar ions in the plasma into the wafer W. Therefore, Cl in the TiON film can be removed by the energy of the Ar ions. Accordingly, the Cl concentration in the film can be reduced. In other words, it is expected that Cl exists in the TiON film with a weak binding energy and thus can be separated from the film by the bombardment effect of Ar ions. Accordingly, Cl in the film can be effectively reduced and, thus, a high purity TiON film can be obtained. Further, due to the Ar ion treatment, the surface smoothness can be improved without sputtering the film.

In the present embodiment, as for the Ti-containing gas, any gas containing Cl may be used. As for the oxidizing agent, an oxygen-containing gas such as O₂ gas, O₃ gas, H₂O, NO₂ or the like may be used. Or, a plasma of the oxygen-containing gas may be used as the oxidizing agent. As for the nitriding gas, monomethylhydrazine (MMH) may be used other than NH₃. As for the carrier gas and the purge gas, another inert gas such as Ar gas or the like may be used instead of N₂ gas.

In the case of using a TiCl₄ gas as a Ti source gas, a NH₃ gas as a nitriding gas, carrier N₂ gas as a carrier gas·purge gas, and O₂ gas as an oxidizing agent, desired ranges of the film forming conditions are the same as those of the first embodiment.

The Ar ion treatment using the apparatus shown in FIG. 12 is performed under the following condition.

Figure 16:
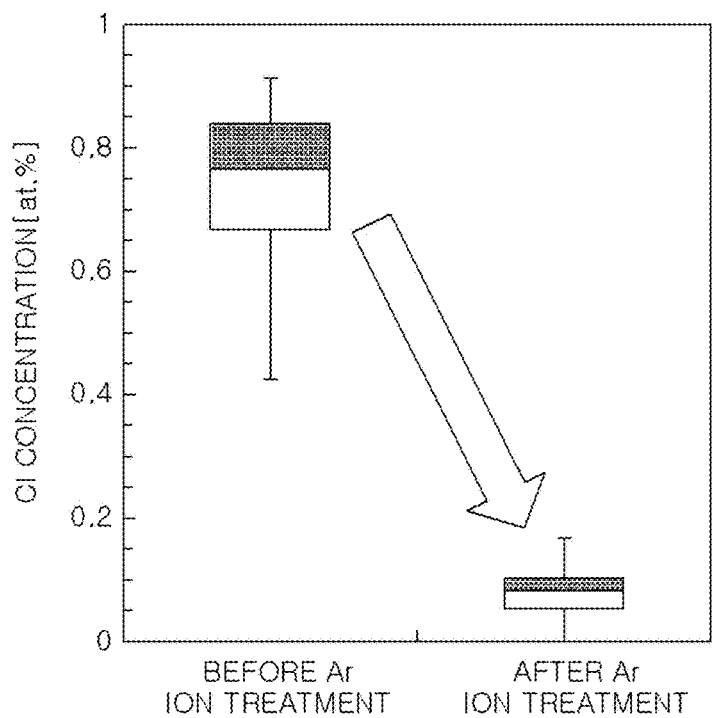
FIG. 16 shows Cl concentration in the TiON film before and after the Ar ion treatment.

High frequency power for plasma generation (13.56 MHz): 1 kW
High frequency bias power supply (13.56 MHz): 1 kW
Pressure in the chamber: 0.33 Pa (2.5 mTorr)
Ar gas flow rate: 55 mL/min (sccm)
Processing time: 3 sec Next, Cl concentrations before and after the Ar ion treatment is performed on the TiON film were compared. In this case, a film forming temperature was set to 430° t and the TiON film was formed by performing 33 times a cycle of repeating the steps S22 to S25 14 times and then executing the steps S26 and S27. The Ar ion treatment was performed under the above-described condition. The Cl concentration was measured at 9 points on the wafer W by XPS and the average thereof was obtained. The result thereof is shown in FIG. 16. As shown in FIG. 16, the Cl concentration was 0.7 at. % before the Ar ion treatment but decreased down to 0.1 at. % after the Ar ion treatment. This shows that the remaining Cl can be effectively removed by the Ar ion treatment.

Figure 17:
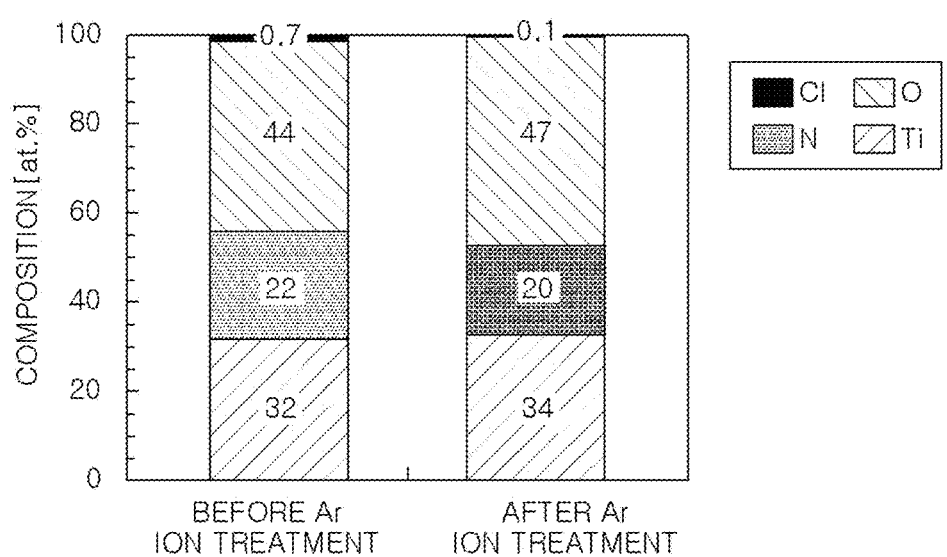
FIG. 17 shows a composition of the TiON film before and after the Ar ion treatment.

Then, the composition of the TiON film before and after the Ar ion treatment was analyzed by XPS. The result thereof is shown in FIG. 17. As can be seen from FIG. 17, the composition of the TiON film was hardly changed after the Ar ion treatment and only the separation of Cl in the film was monitored.

Figure 18A:
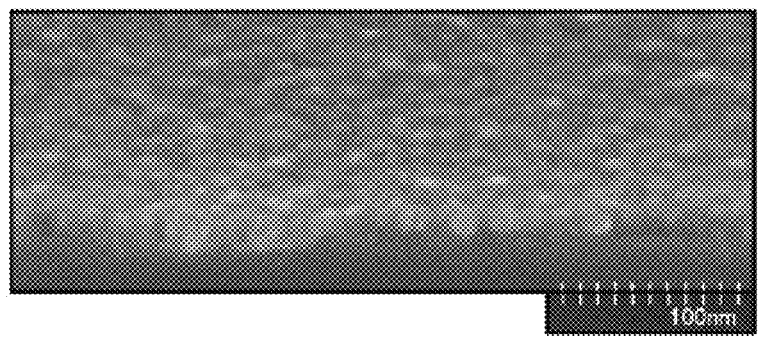
FIGS. 18A and 18B are SEM images of a surface of the TiON film before and after the Ar ion treatment.
Figure 18B:
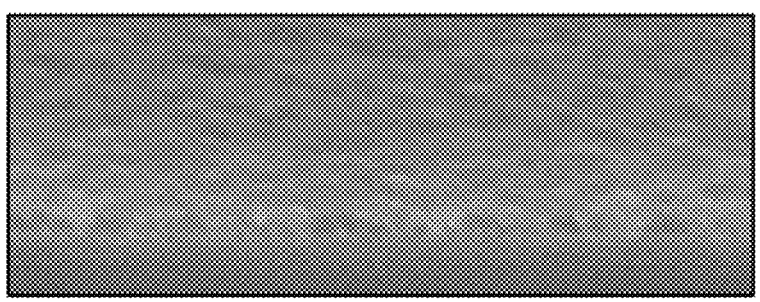

FIGS. 18A and 18B show SEM images of the surface of the TiON film before and after the Ar ion treatment. As can be seen from the SEM images, the surface smoothness of the film was improved after the Ar ion treatment.

Figure 19:
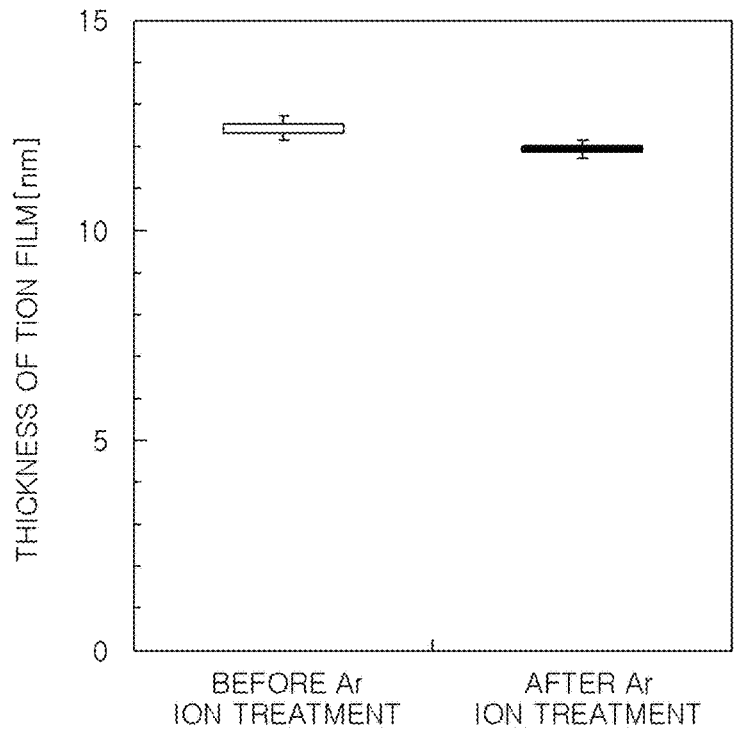
FIG. 19 shows a film thickness of a TiON film before and after the Ar ion treatment.

FIG. 19 shows film thicknesses of the TiON film before and after the Ar ion treatment. In this case, the film thicknesses were measured at 9 points on the wafer W and the average thereof was obtained. As can be seen from FIG. 19, a difference in the film thicknesses of the TiON film before and after the Ar ion treatment was small (0.5 nm). This indicates that the film was flattened by the bombardment impact of Ar ions, not by the sputtering.

Although the film forming apparatus 100 and the Ar ion processing apparatus 200 may be provided as separate apparatuses, it is preferable to use a system in which the film forming apparatus 100 and the Ar ion processing apparatus 200 connected to the same transfer system can perform the TiON film formation and the Ar ion treatment in a vacuum state.

Figure 20:
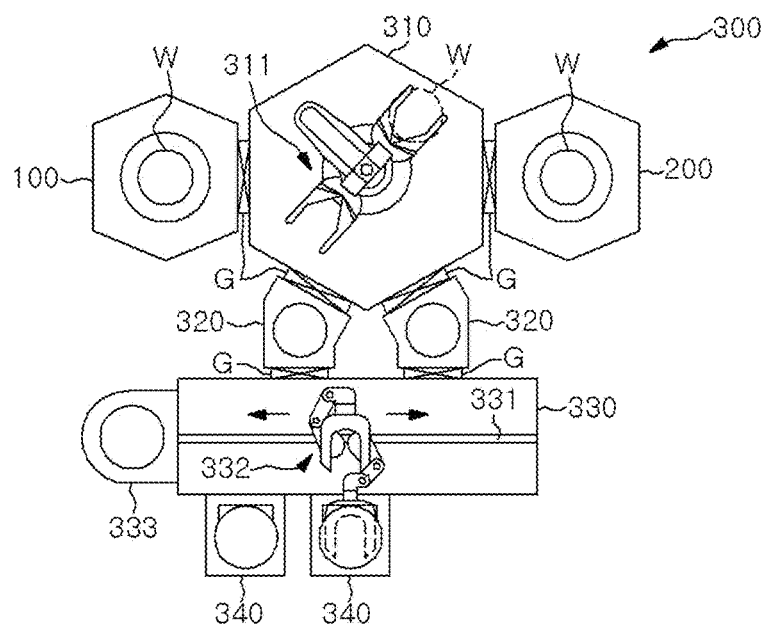
FIG. 20 schematically shows an example of a processing system capable of performing a TiON film forming process and an Ar ion treatment.

FIG. 20 schematically shows an example of a processing system capable of performing the TiON film formation and the Ar ion treatment. A processing system 300 includes a vacuum transfer chamber 310 having a hexagonal shape when seen from the top. The film forming apparatus 100 and the Ar ion processing apparatus 200 are connected to the vacuum transfer chamber 310 via gate valves G while facing each other. Further, two load-lock chambers 320 are connected to the vacuum transfer chamber 310.

The vacuum transfer chamber 310 is maintained at a predetermined vacuum atmosphere. A wafer transfer unit 311 for transferring the wafer W is provided in the vacuum transfer chamber 310. The wafer transfer unit 311 transfers the wafer to the film forming apparatus 100, the Ar ion treatment apparatus 200, and the two load-lock chambers 320.

An atmospheric transfer chamber 330 is provided at a side of the load-lock chambers 320 which is opposite to the side where the vacuum transfer chamber 310 is provided. The load-lock chambers 320 and the atmospheric transfer chamber 330 are connected via gate valves G. Carriers 340 where wafers W are accommodated are connected to the atmospheric transfer chamber 330. In the atmospheric transfer chamber 330, a rail 331 is provided along the arrangement direction of the carriers 340 and a wafer transfer unit 332 capable of moving on the rail 331 is provided. An alignment chamber 333 where the wafer W is aligned is provided at a side surface of the atmospheric transfer chamber 330.

In the processing system 300 configured as described above, the wafer W unloaded from the carrier 340 by the wafer transfer unit 332 is loaded into the load-lock chamber. After the load-lock chamber 320 is maintained in a vacuum state 320, the wafer W in the load-lock chamber 320 is received by the wafer transfer unit 311 in the vacuum transfer chamber 310. Next, the wafer W is transferred to the film forming apparatus 100 and subjected to the TiON film formation. Then, the wafer W is transferred to the Ar ion processing apparatus 200 and subjected to the Ar ion treatment. Thereafter, the processed wafer is transferred to the load-lock chamber 320 by the wafer transfer unit 311. After a pressure in the load-lock chamber 320 is returned to the atmospheric pressure, the wafer W is returned to the carrier 340 by the wafer transfer unit 332.

In the above-described manner, the TiON film formation and the Ar ion treatment can be consecutively performed in the vacuum state.

Figure 21:
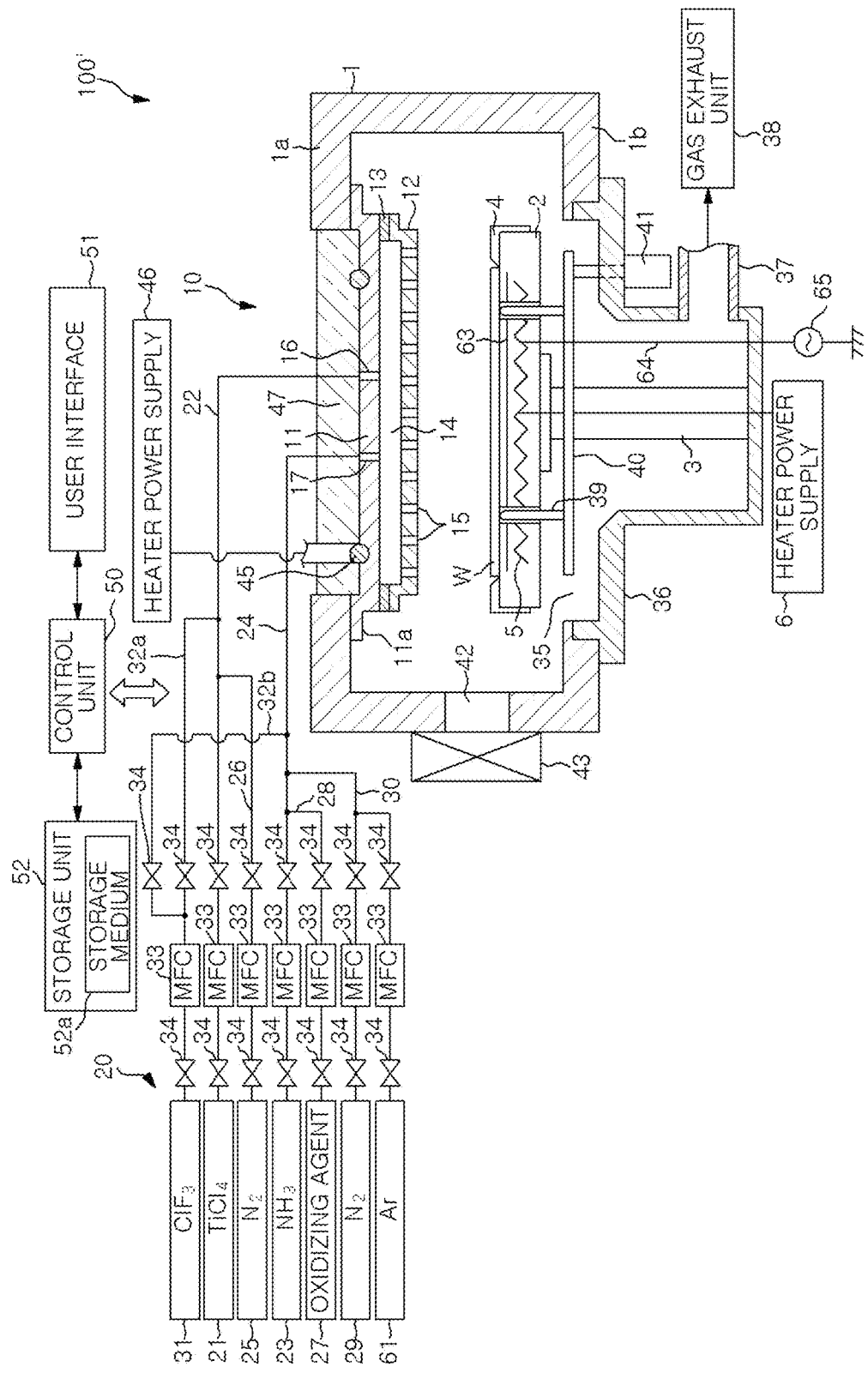
FIG. 21 is a cross sectional view showing a film forming apparatus capable of consecutively performing a TiON film forming process and an Ar ion treatment in the same chamber.

If the film forming apparatus has a function of performing the Ar ion treatment, the TiON film formation and the Ar ion treatment can be performed consecutively in the same chamber. FIG. 21 is a cross sectional view of such a film forming apparatus. A film forming apparatus 100' basically has the same configuration as that of the film forming apparatus 100 shown in FIG. 1. However, the film forming apparatus 100' is different from the film forming apparatus 100 in that it further includes an Ar gas supply function and an Ar plasma generation function. In other words, a gas supply unit 20 of the film forming apparatus 100' further has an Ar gas supply source 61 and an Ar gas supply line 62 for supplying Ar gas from the Ar gas supply source 61. The Ar gas supply line 62 is connected to an $N_2$ gas supply line 30. A mass flow controller 33 and two valves 34 disposed at an upstream side and a downstream side thereof are provided at the Ar gas supply line 62. Accordingly, Ar gas can be supplied into the chamber 1.

An electrode 63 is provided in the susceptor 2. A high frequency power supply 65 is connected to the electrode 63 via a power feed line 64. By supplying a high frequency power from the high frequency power supply 65 to the electrode 63, a high frequency electric field is generated between the electrode 63 and the shower head 10. A plasma of Ar gas is generated by generating the high frequency electric field in a state where Ar gas is supplied into the chamber 1. The high frequency power supplied from the high frequency power supply 65 also serves as a high frequency bias power for attracting Ar ions to the wafer W on the susceptor 2. Therefore, it is possible to perform, after the TiON film is formed in the chamber 1 as described above, the Ar ion treatment on the wafer W by generating an Ar plasma in the chamber 1 and attracting Ar ions to the wafer W.

A throughput can be increased because the Ar ion treatment of the step S30 can be performed in the chamber 1 consecutively after the TiON film formation of the steps S22 to S27 is performed by the film forming apparatus 100' in a state where the wafer W is maintained on the susceptor 2 in the chamber 1.

The Ar ion treatment apparatus is not limited to the above-described example as long as it can supply Ar ions to the wafer W.

The Ar ion treatment in the present embodiment may be applied to the TiON film forming methods of the first and the second embodiment. In that case as well, the same effect can be obtained.

Fourth Embodiment

Hereinafter, a fourth embodiment will be described.

In a fourth embodiment, a TiON film is formed by using the film forming apparatus 100 shown in FIG. 1 by a technique in which oxidation is enhanced compared to the first embodiment.

Hereinafter, an example of the TiON film forming method of the present embodiment will be described.

First, as in the first embodiment, the pre-coating is performed and the gate valve 43 is opened. The wafer W is unloaded from a wafer transfer chamber (not shown) and loaded into the chamber 1 through the loading/unloading port 42 by a transfer unit (not shown) and then mounted on the susceptor 2. The wafer W is heated by the heater 5 to a predetermined temperature preferably ranging from 300° C. to 500° C. The wafer W is preliminarily heated by the heater 5 while supplying $N_2$ gas into the chamber 1. When the temperature of the wafer W is almost stabilized, the TiON film formation is started.

In forming the TiON film, the oxidation efficiency may be insufficient in the sequence of FIG. 2 which is the base of the first embodiment. Specifically, if the aspect ratio is increased as the miniaturization of the devices progresses, e.g., as an opening of a capacitor structure of a DRAM becomes narrower, the oxidation may be insufficient in the sequence of FIG. 2 which is the base of the first embodiment, because the amount of oxygen supplied to the via bottom (cylinder bottom) may be insufficient.

Therefore, in the present embodiment, in the oxidation process performed after the formation of the unit TiN film, an oxidizing agent (e.g., $O_2$ gas) is intermittently supplied multiple times. Accordingly, the supply of the oxidizing agent is increased and, thus, the oxidation efficiency can be increased. Especially, it is possible to supply the oxidizing agent to the bottom of the via having a high aspect ratio, so that insufficient oxidation is prevented. This is because, in the case of intermittently supplying the oxidizing agent, the oxidizing agent of a high pressure is collected in a line during a period in which the oxidizing agent is not supplied by closing the valve and the collected oxidizing agent of a high pressure is supplied when the valve is opened.

An example of a specific sequence will be described with reference to the timing chart of FIG. 22 and the flowchart of FIG. 23.

Figure 22:
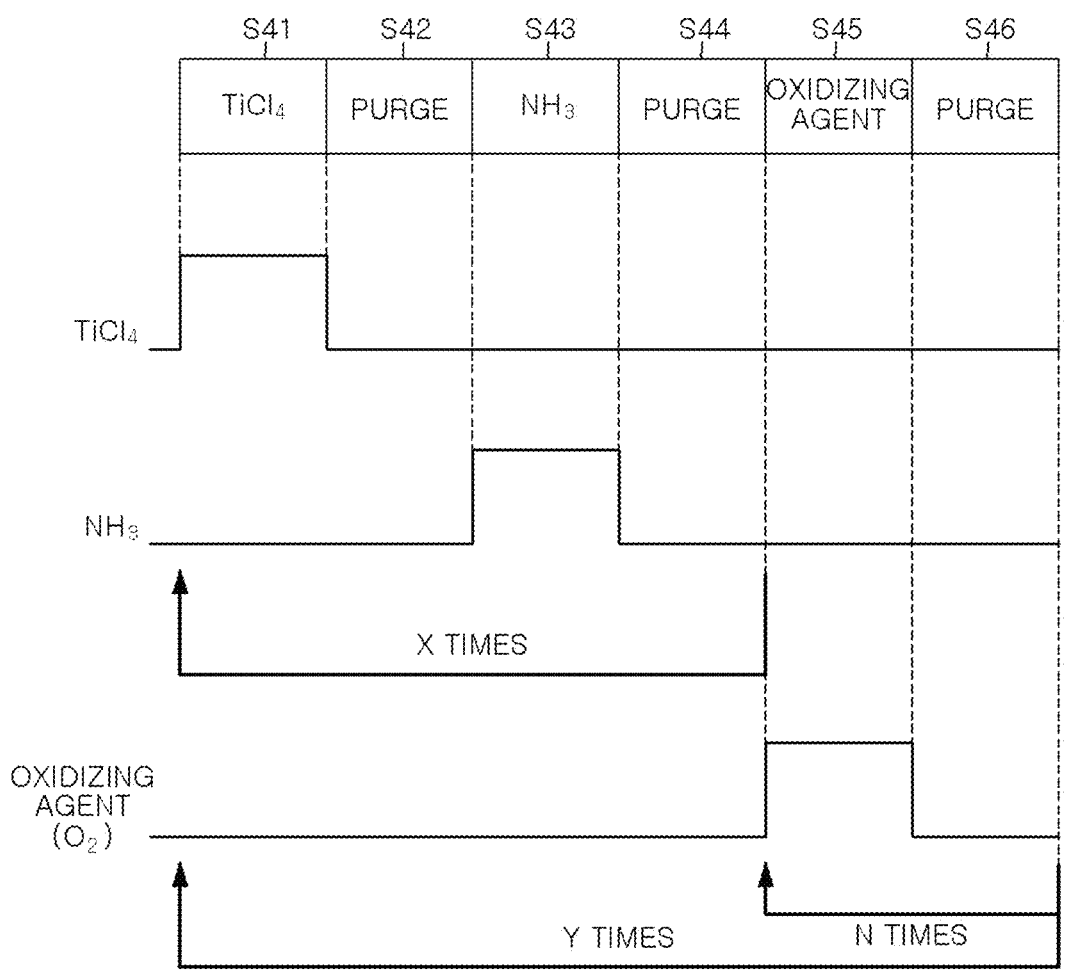
FIG. 22 is a timing chart showing an example of a specific sequence of a method for forming a TiON film according to a fourth embodiment.
Figure 23:
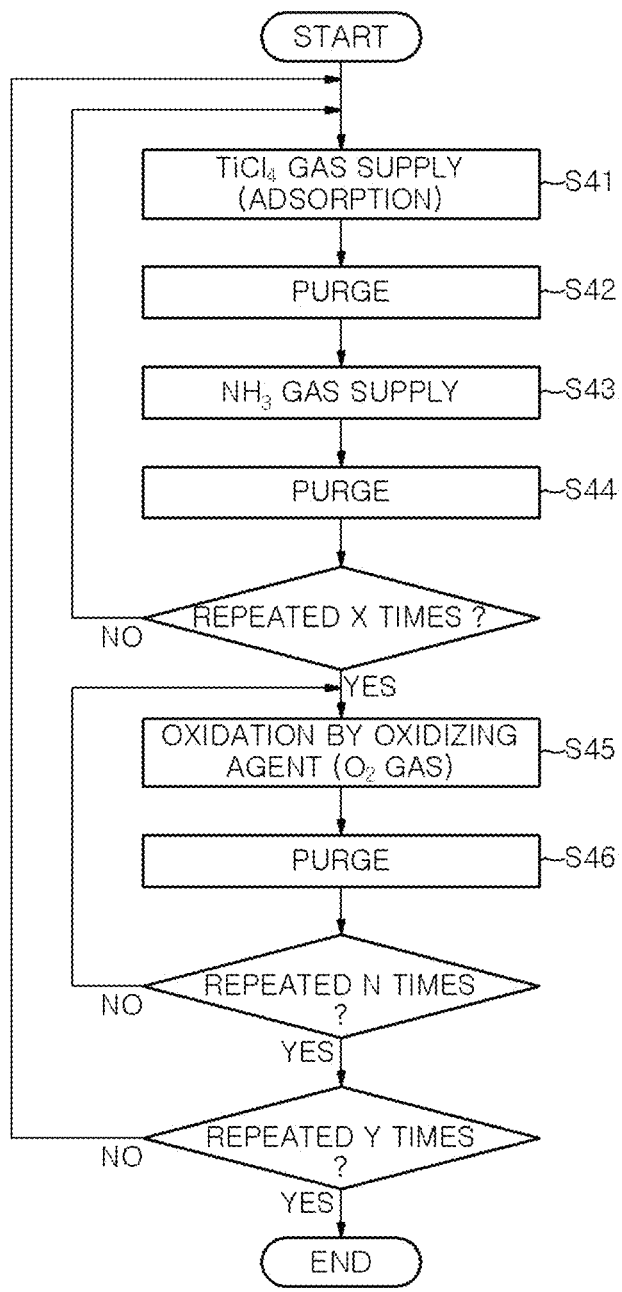
FIG. 23 is a flowchart showing the example of the specific sequence of the method for forming a TiON film according to the fourth embodiment.

As shown in FIGS. 22 and 23, first, as in the steps S1 to S4 of the first embodiment, $TiCl_4$ gas is supplied from the $TiCl_4$ gas supply source 21 into the chamber 1 to be adsorbed (step S41). Next, the supply of $TiCl_4$ gas is stopped and the chamber 1 is purged by $N_2$ gas (step S42). Then, $NH_3$ gas is supplied from the $NH_3$ gas supply source 23 into the chamber 1 and made to react with the adsorbed $TiCl_4$, thereby forming TiN (step S43). Thereafter, the supply of $NH_3$ gas is stopped and the chamber 1 is purged by $N_2$ gas (step S44). The steps S41 to S44 are repeated X times. Then, a cycle of supplying an oxidizing agent (e.g., $O_2$ gas) from the oxidizing agent supply source 27 into the chamber 1 (step S45) and purging the chamber 1 (step S46) is repeated N times so that an oxidation process is performed by intermittently supplying oxygen. By repeating Y times a cycle of repeating the steps S41 to S44 X times and repeating the steps S45 and S46 N times, a TiON film having a desired thickness is formed.

Figure 24:
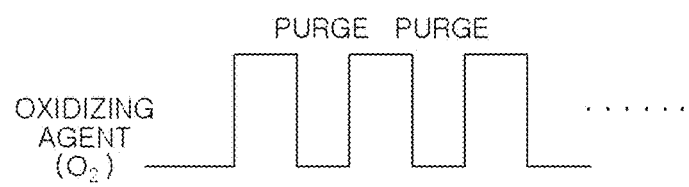
FIG. 24 shows an example of supplying an oxidizing agent in a pulsed manner in the fourth embodiment.

At this time, it is preferable to supply the oxidizing agent (e.g., $O_2$ gas) in a pulsed manner as can be seen from FIG. 24. A single supply period of an oxidizing agent may be 0.05 sec to 30 sec. It is preferably 0.05 sec to 5 sec and more preferably 0.05 sec to 3 sec. A total oxidation time is calculated by multiplying the single supply period of the oxidizing agent by the number of cycles. The oxidation efficiency tends to be increased by increasing the number of cycles N by somewhat reducing the single supply period of the oxidizing agent. However, if the single supply time is too short, it is difficult to supply the oxidizing agent.

The amount of oxygen in the TiON film can be controlled by the number of repetition N of the steps S41 to S44. In other words, when the number of repetition X is decreased, the frequency of oxidation is increased and, thus, the concentration of oxygen in the film is increased. On the contrary, when the number of repetition X is increased, the concentration of oxygen in the film is decreased. The film thickness can be controlled by the number of repetition Y. The oxygen concentration in the TiON film can also be adjusted by the oxidation time or the flow rate of the oxidizing agent as well as by the number of repetition of the steps S41 to S44.

After the TiON is formed as described above, the chamber 1 is vacuum-evacuated and the wafer W is unloaded.

The oxidation efficiency can be improved by repeating the oxidizing agent supply of the step 45 and the purge process of the step 46 and performing the oxidation process by intermittently supplying the oxidizing agent. Further, since the oxidizing agent can be sufficiently supplied to the bottom of the via having a high aspect ratio, the oxidation occurs sufficiently.

In the present embodiment as well, as for the oxidizing agent, an oxygen-containing gas such as $O_2$ gas, $O_3$ gas, $H_2O$, $NO_2$ or the like may be used. Or, a plasma of an oxygen-containing gas may be used as the oxidizing agent. As for the Ti-containing gas, tetra(isopropoxy)titanium (TTIP), titanium(IV)bromide (TiBr$_4$), titanium(IV)Iodide (TiI$_4$), tetrakisethylmethylaminotitanium (TEMAT), tetrakisdimethylaminotitanium (TDMAT), tetrakisdiethylaminotitanium (TDEAT) or the like may be used other than $TiCl_4$. As for the nitriding gas, monomethylhydrazine (MMH) may be used other than $NH_3$. As for the carrier gas and the purge gas, another inert gas such as Ar gas or the like may be used instead of $N_2$ gas.

In the case of using a $TiCl_4$ gas as a Ti source gas, a $NH_3$ gas as a nitriding gas, carrier $N_2$ gas as a carrier gas·purge gas, and $O_2$ gas as an oxidizing agent, desired ranges of the film forming conditions are as follows.

Processing temperature (susceptor temperature): 300 to 500° C.
Pressure in chamber: 13.33 to 1333 Pa (0.1 to 10 Torr)
$TiCl_4$ gas flow rate: 10 to 200 mL/min (sccm)
$NH_3$ gas flow rate: 1000 to 10000 mL/min (sccm)
$N_2$ gas flow rate: 1000 to 30000 mL/min (sccm)
Duration of steps 41 to 44: 0.01 to 3 sec
$O_2$ gas flow rate: 10 to 3000 mL/min (sccm)
$O_2$ gas supply period: 0.1 to 60 sec Hereinafter, a result of examining the effect of the present embodiment will be described.

A TiON film was formed by using $TiCl_4$ gas as a Ti source gas, $NH_3$ gas as a nitriding gas, $N_2$ gas as a carrier purge gas, and $O_2$ gas as an oxidizing agent and, then, the oxygen concentration in the film was measured. At this time, X was set to 6 and Y was set to 50. In an oxidation process, $O_2$ gas was supplied under the following conditions A to C. The oxidation time of each of the Y cycles was set to be the same. In the condition A, $O_2$ gas was supplied consecutively at a flow rate of 1400 sccm. In the condition B, $O_2$ gas was supplied consecutive supply at a flow rate of 300 sccm. In the condition C, $O_2$ gas was supplied in a pulsed manner at a flow rate of 300 sccm. In the condition C in which $O_2$ gas is supplied in a pulsed manner, a single supply period of $O_2$ gas was set to 0.2 sec and the oxidation time was controlled by the number of cycles N. The relation between the oxidation time and the number of cycles N at this time is as follows.

| Oxidation time | the number of cycles N |
| --- | --- |
| 0.2 sec | 1 |
| 2 sec | 10 |
| 4 sec | 20 |
| 10 sec | 50 |
| 15 sec | 75 |

Figure 25:
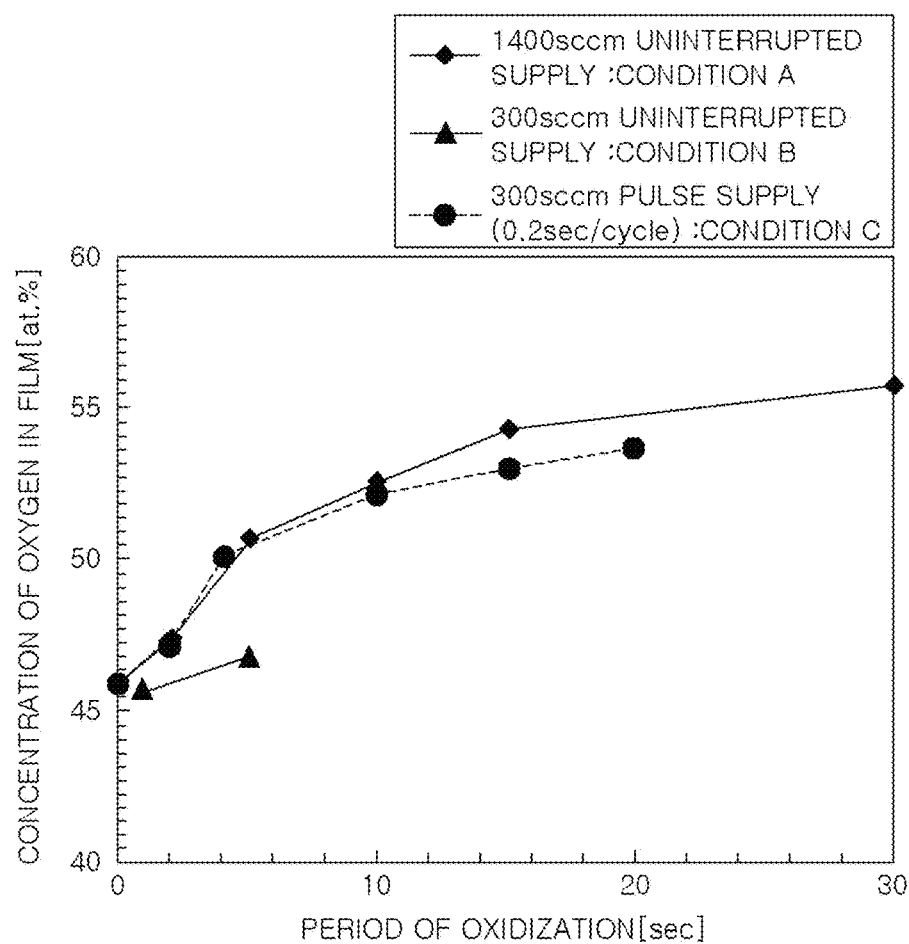
FIG. 25 explains an effect of the fourth embodiment.

The relation between the oxidation time and the oxygen concentration in the film is shown in FIG. 25. In comparing the conditions A and B in which $O_2$ gas is supplied consecutively, at the same oxidation time, the oxygen concentration in the film is higher under the condition A in which the flow rate of $O_2$ gas is higher. In comparing the conditions B and C in which the flow rate of $O_2$ gas is the same, at the same oxidation time, the amount of oxygen (oxygen concentration in the film) is greater under the condition C in which $O_2$ gas is supplied in a pulsed manner. In comparing the condition A in which O₂ gas is supplied consecutively at a flow rate of 1400 sccm and the condition C in which O₂ gas is supplied in a pulsed manner at a flow rate of 300 sccm, the amount of oxygen (oxygen concentration in the film) is the same at the same oxidation time. This shows that the oxidation efficiency can be increased by supplying O₂ gas in a pulsed manner.

The intermittent supply of the oxidizing agent in the present embodiment can be applied to the TiON film forming method of the first to the third embodiment. In that case as well, the effect of improving the oxidation efficiency in forming the TiON film can be obtained.

Especially, by applying the intermittent supply of the oxidizing agent to the second embodiment, it is possible to obtain the effect of improving the oxidation efficiency of the oxidation process performed by intermittently supplying the oxidizing agent while preventing formation of a dangling bond in the unit TiN film by enhancing nitriding.

Figure 26:
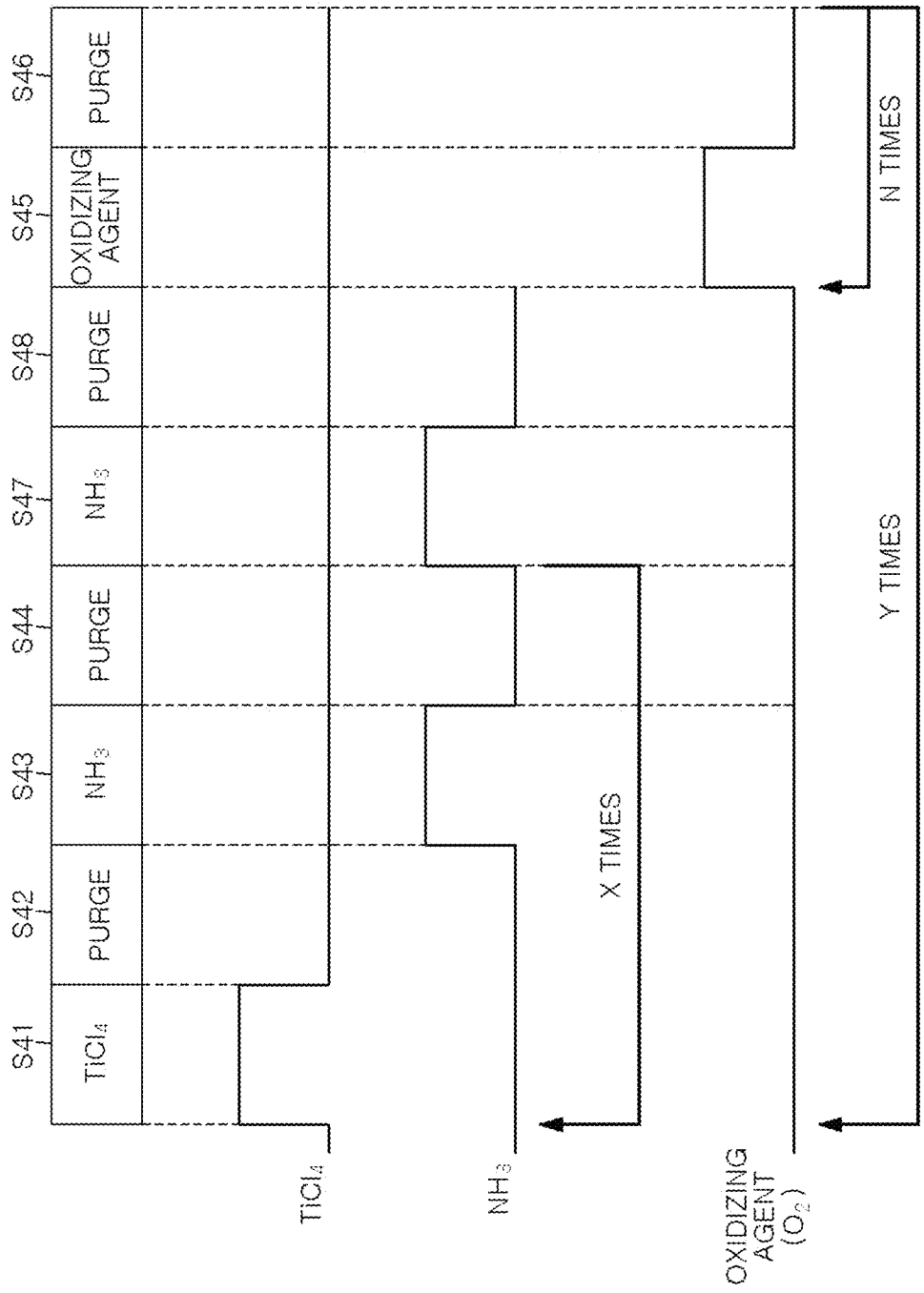
FIG. 26 is a timing chart showing an example of a specific sequence in the case of applying a fourth embodiment to the second embodiment.

FIG. 26 shows a timing chart in the case of applying the present embodiment to the second embodiment. The sequence of FIG. 26 is obtained by adding the post flow process of NH₃ gas (step S47) and the process of purging the chamber 1 by N₂ gas (step S48) to the method shown in FIG. 24. In other words, a TiON film having a desired thickness is formed by repeating Y times a cycle of repeating the unit TiN film formation of the steps S41 to S44 X times, performing the post flow process of NH₃ gas (step S47) and the purge process using N₂ gas (step S48) once or multiple time, and then performing an intermittent oxidation process by repeating the supply of the oxidizing agent (e.g., O₂ gas) into the chamber 1 (step S45) and the process of purging the chamber 1 (step S46) N times. Accordingly, a TiON film having high oxidation efficiency can be formed while suppressing generation of a dangling bond.

(Other Application)

While the embodiments of the disclosure have been described, the disclosure is not limited to the above-described embodiments and may be variously modified within the scope of the technical idea of the disclosure. For example, the film forming apparatus shown in FIG. 1 which is used in the above-described embodiments is merely an example and the film forming apparatus of the disclosure is not limited to that shown in FIG. 1. Although the semiconductor wafer has been described as an example of the target substrate, the target substrate of the disclosure is not limited thereto in view of the principle of the disclosure and may be another substrate such as a substrate for FTP which is represented by a substrate for LCD or the like.

While the disclosure has been shown and described with respect to the embodiments, it will be understood by those skilled in the art that various changes and modifications may be made without departing from the scope of the disclosure as defined in the following claims.

What is claimed is:

1. A TiON film forming method comprising:
    accommodating a target substrate in a processing chamber;
    maintaining an inside of the processing chamber in a depressurized state; and
    repeating multiple times a cycle of forming a unit TiN film at a predetermined processing temperature by alternately supplying a Ti-containing gas and a nitriding gas into the processing chamber and oxidizing the unit TiN film by supplying an oxidizing agent into the processing chamber,
    wherein in an initial stage of the film formation, a cycle of supplying the oxidizing agent after repeating the alternate supply of the Ti-containing gas and the nitriding gas X1 times is repeated Y1 times,
    wherein in a later stage of the film formation; a cycle of supplying the oxidizing agent after repeating the alternate supply of the Ti-containing gas and the nitriding gas X2 times is repeated Y2 times until a desired film thickness is obtained,
    wherein the number of repetition X1 in the initial stage of the film formation is set to be greater than the number of repetition X2 in the later stage of the film formation, and
    wherein the Y1 is within a range of wherein a relation between X1 and X2 is selected based on a desired film surface smoothness.

2. The TiON film forming method of claim 1, wherein the X1 is within a range of 10≤X≤160 and the X2 is within a range of 1≤X2≤25.

3. The TiON film forming method of claim 1, wherein the X1 is at least three times greater than the X2.

4. The TiON film forming method of claim 1, further comprising:
    after the forming of the unit TiN film and before the oxidizing of the unit TiN film, performing a post flow process of supplying the nitriding gas into the processing chamber.

5. The TiON film forming method of claim 4, wherein the post flow process is performed by repeating supply of the nitriding gas and supply of a purge gas multiple times.

6. The TiON film forming method of claim 4, wherein the oxidizing agent is supplied intermittently multiple times.

7. The TiON film forming method of claim 1, further comprising:
    after the film formation, performing Ar ion treatment on the surface of the film.

8. The TiON film forming method of claim 7, wherein the Ar ion treatment is performed by generating an Ar plasma and attracting Ar ions in the Ar plasma to the target substrate.

9. The TiON film forming method of claim 7, wherein the Ar ion treatment is performed on the surface of the film by bombardment effect of the Ar ions.

10. The TiON film forming method of claim 7, wherein the film formation and the Ar ion treatment are performed by separate apparatuses.

11. The TiON film forming method of claim 10, wherein the apparatus for performing the film formation and the apparatus for performing the Ar ion treatment are installed in a processing system including a transfer system for transferring the target substrate in a vacuum state and consecutively perform the film formation and the Ar ion treatment while maintaining a vacuum state.

12. The TiON film forming method of claim 7, wherein the film formation and the Ar ion treatment are performed in a same processing chamber.

13. The TiON film forming method of claim 1, wherein the oxidizing of the unit Ti N film is performed by intermittently supplying the oxidizing agent into the processing chamber.

14. The TiON film forming method of claim 1, wherein the Ti-containing gas is TiCl₄ gas and the nitriding gas is NH₃ gas.

15. The TiON film forming method of claim 1, wherein the oxidizing agent is an oxygen-containing gas selected from a group consisting of O₂ gas, O₃ gas, H₂O and NO₂ or a plasma of the oxygen-containing gas.

16. The TiON film forming method of claim 1, wherein the processing temperature ranges from 300° C. to 500° C.

17. The TiON film forming method of claim 13, wherein the oxidizing agent is supplied in a pulsed manner.

18. The TiON film forming method of claim 13, wherein the oxidizing of the unit TiN film is performed by repeating multiple times a cycle of supplying the oxidizing agent into the processing chamber and purging the processing chamber.

* * * * *